United States Patent
Tanada et al.

(10) Patent No.: US 7,250,931 B2
(45) Date of Patent: Jul. 31, 2007

(54) LIGHT EMITTING APPARATUS AND METHOD OF DRIVING SAME

(75) Inventors: Yoshifumi Tanada, Kanagawa (JP); Mitsuaki Osame, Kanagawa (JP); Aya Anzai, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 324 days.

(21) Appl. No.: 10/387,063

(22) Filed: Mar. 12, 2003

(65) Prior Publication Data

US 2003/0174106 A1 Sep. 18, 2003

(30) Foreign Application Priority Data

Mar. 14, 2002 (JP) ............... 2002-070587

(51) Int. Cl.
*G09G 3/36* (2006.01)

(52) U.S. Cl. ....................................... 345/87

(58) Field of Classification Search ............... 345/83, 345/76, 88, 102, 206, 205, 92, 39, 44, 46, 345/55, 64, 82
See application file for complete search history.

(56) References Cited

U.S. PATENT DOCUMENTS

| | | | |
|---|---|---|---|
| 4,450,715 A | 5/1984 | Sumal | |
| 4,888,523 A | 12/1989 | Shoji et al. | 315/169.3 |
| 4,969,718 A | 11/1990 | Noguchi et al. | 350/339 |
| 5,399,502 A | 3/1995 | Friend et al. | 437/1 |
| 5,652,600 A | 7/1997 | Khormaei et al. | 345/76 |
| 5,940,053 A | 8/1999 | Ikeda | 345/77 |
| 5,990,629 A | 11/1999 | Yamada et al. | 315/169.3 |
| 6,078,304 A * | 6/2000 | Miyazawa | 345/88 |

(Continued)

FOREIGN PATENT DOCUMENTS

CN 1278635 1/2001

(Continued)

OTHER PUBLICATIONS

English Abstract re Japanese Patent Application No. JP 3259388 (corresponding to laid-open application No. JP 6-175615).

(Continued)

*Primary Examiner*—Sumati Lefkowitz
*Assistant Examiner*—Tammy Pham
(74) *Attorney, Agent, or Firm*—Cook, Alex, McFarron, Manzo, Cummings & Mehler, Ltd.

(57) ABSTRACT

In a light emitting apparatus, all pixels are fabricated using monochrome light-emitting materials. Since the light transmittances of color filters or color conversion layers are not uniform among red (R), green (G), and blue (B), exact white color cannot be displayed. In the present invention, dots for producing these colors of light, i.e., red (R), green (G), and blue (B), are arranged parallel to writing scan lines and to erasing scan lines. The brightnesses are made uniform by controlling the emission times of the emitted colors of light. According to the brightnesses obtained after passage through the colored layer with the lowest light transmittance, the emission times of colors of light passed through the other colored layers are shortened. Thus, as the brightness differences after passage can be reduced, the light emitting apparatus can display exact white color.

42 Claims, 14 Drawing Sheets

U.S. PATENT DOCUMENTS

| | | | |
|---|---|---|---|
| 6,172,807 B1 * | 1/2001 | Akamatsu | 359/462 |
| 6,246,180 B1 | 6/2001 | Nishigaki | 315/169.3 |
| 6,339,411 B2 * | 1/2002 | Miyazaki et al. | 345/1.1 |
| 6,424,326 B2 | 7/2002 | Yamazaki et al. | 345/77 |
| 6,498,356 B1 | 12/2002 | Sekiya et al. | 257/113 |
| 6,501,227 B1 | 12/2002 | Koyama | 315/169.3 |
| 6,538,242 B1 | 3/2003 | Kuno et al. | 250/208.1 |
| 6,583,775 B1 | 6/2003 | Sekiya et al. | |
| 6,700,330 B2 | 3/2004 | Koyama | 315/169.3 |
| 6,839,045 B2 * | 1/2005 | Ozawa et al. | 345/92 |
| 2001/0023661 A1 | 9/2001 | Hiroki et al. | |
| 2002/0033809 A1 | 3/2002 | Nakajima | 345/204 |
| 2002/0084952 A1 * | 7/2002 | Morley et al. | 345/32 |
| 2003/0089410 A1 | 5/2003 | Young | |
| 2003/0117083 A1 | 6/2003 | Koyama | 315/169.3 |
| 2003/0189410 A1 | 10/2003 | Yamazaki et al. | 315/169.1 |
| 2004/0041781 A1 * | 3/2004 | Sato et al. | |

FOREIGN PATENT DOCUMENTS

| | | |
|---|---|---|
| CN | 1290041 | 4/2001 |
| CN | 1338719 | 3/2002 |
| EP | 0 189 214 A2 | 7/1986 |
| EP | 1 061 497 | 12/2000 |
| EP | 1 087 366 A2 | 3/2001 |
| EP | 1 174 849 A2 | 1/2002 |
| JP | 07-175439 A2 | 7/1995 |
| JP | 10-039791 | 2/1998 |
| JP | 2001-142427 | 5/2001 |
| JP | 2001-159878 | 6/2001 |
| JP | 2001-257163 | 9/2001 |
| JP | 2001-291588 | 10/2001 |
| JP | 2002-032051 | 1/2002 |
| JP | 2003-131619 | 5/2003 |

OTHER PUBLICATIONS

English Abstract re Japanese Patent Application No. JP 3259488 (corresponding to laid-open application No. JP 7-159755).

English Abstract re Japanese Patent Application No. JP 2001-060076, published Mar. 6, 2001.

Yumoto, A. et al, "Pixel-Driving Methods for Large-Sized Poly-Si AM-OLED Displays," Asia Display/IDW '01, pp. 1395-1398.

Office action re Chinese application No. 03110739.7, dated Dec. 22, 2006 (with English translation).

* cited by examiner

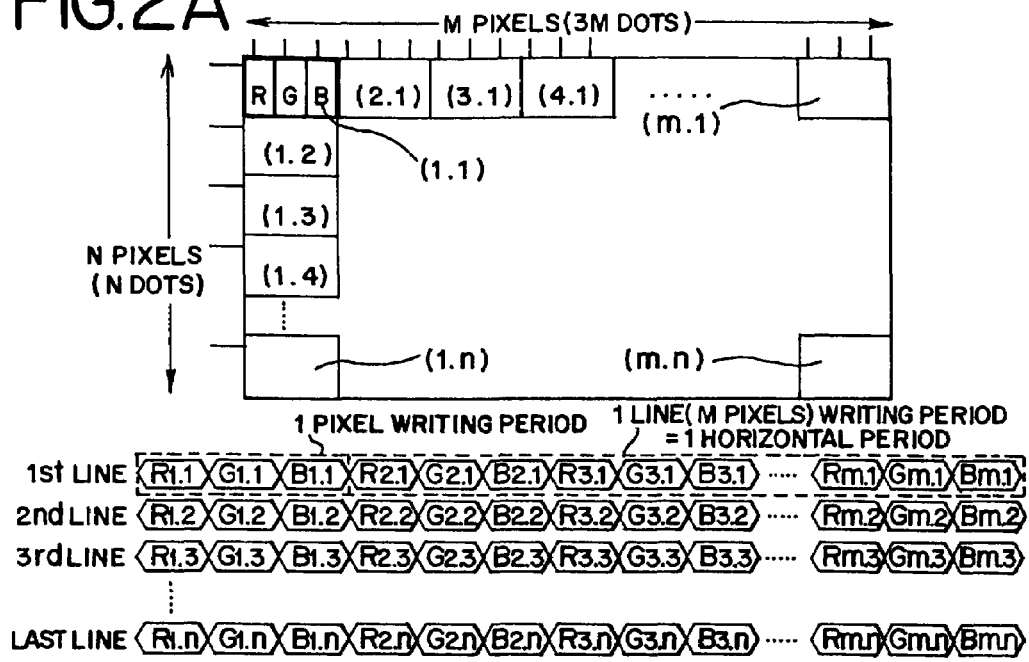
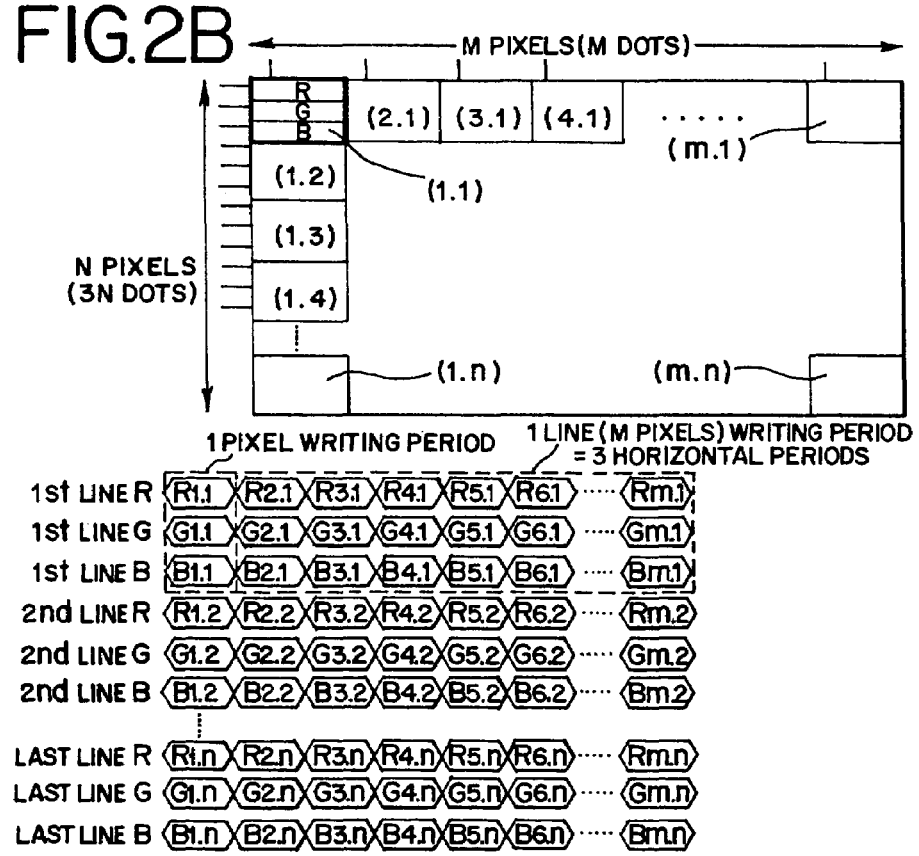

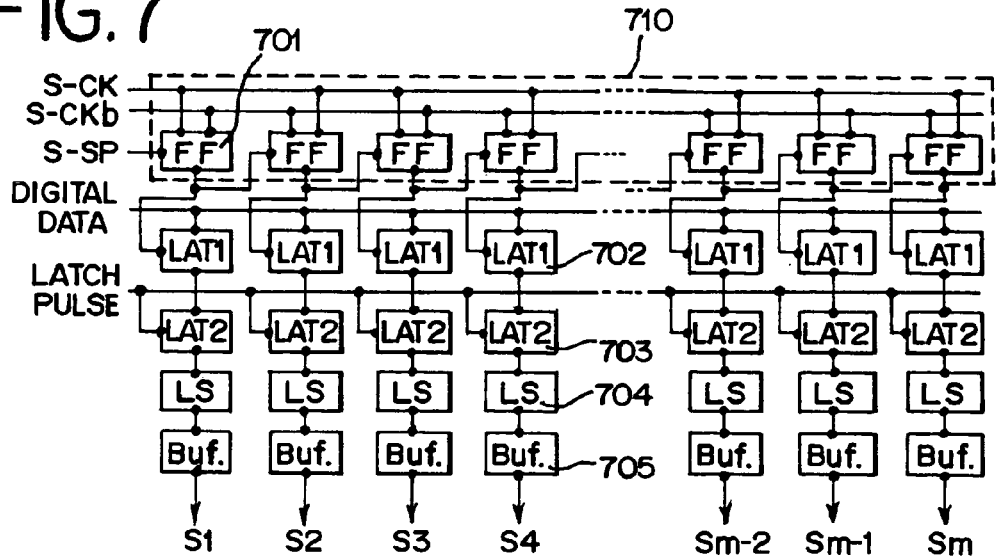
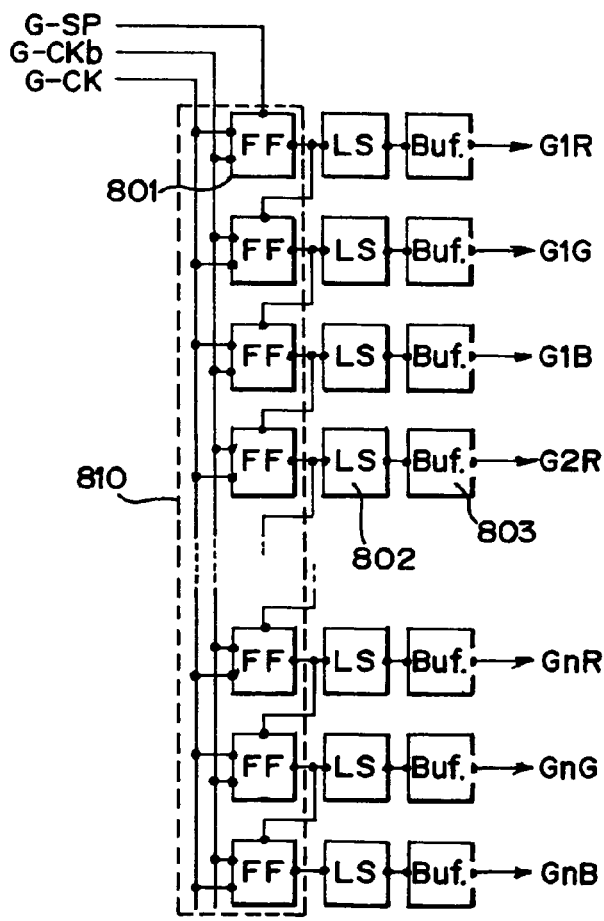

LIGHT EMITTING APPARATUS AND METHOD OF DRIVING SAME

BACKGROUND OF THE INVENTION

1. Field of the Invention

The present invention relates to a light emitting apparatus fitted with light-emitting devices and, more particularly, to a light emitting apparatus on which a display portion for displaying multiple colors is formed. The invention also relates to a driving method for displaying multiple colors.

2. Description of the Related Art

In recent years, a light emitting apparatus using light-emitting devices that are self-emitting devices have been studied and developed. These light emitting apparatus are widely used as the display screens of mobile phones and as a light emitting apparatus when personal computers are used, by making use of their merits including high image quality, thinness, and lightweight.

In this light emitting apparatus, a known method to display multiple colors consists of fabricating all light-emitting devices of the pixel portion using monochrome light-emitting materials and obtaining desired colors of light using color filters or color conversion layers corresponding to RGB light-emitting devices. In particular, in one type of system, light-emitting devices emitting white light and color filters are combined. In another type of system, light-emitting devices emitting blue light are combined with color conversion layers. In a further known system, a light-emitting material emitting light of a different color is applied to each of RGB light-emitting devices.

When multiple colors are displayed on a light emitting apparatus by the method of fabricating all light-emitting devices of the pixel portion using monochrome light-emitting materials and obtaining desired colors of light using color filters or color conversion layers corresponding to the RGB light-emitting devices, the light transmittances of the color filters or color conversion layers are sometimes not uniform among red (R), green (G), and blue (B)(also simply abbreviated RGB). The apparent brightness obtained by transmission through such a color filter or color conversion layer is (brightness of monochrome light-emitting device)×(light transmittance of color filter or color conversion layer).

Accordingly, even if the light-emitting devices are uniform in brightness, the apparent brightnesses obtained by passage through the color filters or color conversion layers will differ unless the color filters of red (R), green (G), and blue (B) or color conversion layers are uniform in light transmittance.

The manifestation of these brightness variations is not limited to the color filters or color conversion layers. Therefore, color filters or color conversion layers are collectively referred to as colored layers.

SUMMARY OF THE INVENTION

In view of the foregoing problem, the present invention has been made. The invention proposes light-emitting apparatus capable of displaying exact white color.

The invention also proposes a light emitting apparatus and driving method in which the burden on the external circuit is reduced and which achieves a high numerical aperture by reducing the number of input power supplies.

In order to solve the forgoing problem, the present invention is characterized by providing a difference among emission times of red (R), green (G), and blue (B). That is to say, a colored layer with the lowest light transmittance is made to response brightness after transmission, and emission times for transmittance of remaining colored layers are made short, then brightness after transmittance came from, (brightness of monochrome light-emitting device)×(light transmittance of color filter or color conversion layer)×(emission times), can be uniformed in RGB, and light-emitting apparatus capable of displaying exact white color are achieved.

The structure of the present invention will be described as below.

According to the present invention, a light emitting apparatus is provided, which has a pixel portion, plural data lines, plural first scan lines, and plural second scan lines, the pixel portion having pixels arranged in a matrix, the pixels including first light-emitting devices emitting a first color of light, second light-emitting devices emitting a second color of light, and third light-emitting devices emitting a third color of light;

wherein the first through third light-emitting devices are arranged in the same column and each disposed parallel to the first scan lines or the second scan lines; and wherein a ratio of light intensities of the first color of light: the second color of light: the third color of light is $\alpha:\beta:\gamma$, and a ratio of emission times of the first light-emitting device: the second light-emitting device: the third light-emitting device is $1/\alpha:1/\beta:1/\gamma$ while the light emitting apparatus displays white color.

According to the present invention, a light emitting apparatus is provided, which has a pixel portion, plural data lines, plural first scan lines, and plural second scan lines, the pixel portion having pixels arranged in a matrix, the pixels including first light-emitting devices emitting a first color of light, second light-emitting devices emitting a second color of light, and third light-emitting devices emitting a third color of light;

wherein each of the first through third light-emitting devices has the data lines, the first data lines, the second data lines, and first through third transistors;

wherein the first transistors have gate electrodes electrically connected with the first scan lines;

wherein the second transistors have gate electrodes electrically connected with the second scan lines;

wherein the third transistors have gate electrodes electrically connected with any one of source regions and drain regions of the first transistors;

wherein any one of source regions and drain regions of the third transistors is electrically connected with the light-emitting devices;

wherein the first through third light-emitting devices are each disposed parallel to the first scan lines or the second scan lines; and wherein a ratio of light intensities of the first color of light: the second color of light: the third color of light is $\alpha:\beta:\gamma$, and a ratio of emission times of the first light-emitting device the second light-emitting device: the third light-emitting device is $1/\alpha:1/\beta:1/\gamma$ while the light emitting apparatus displays white color.

According to the present invention, a light emitting apparatus is provided, which has a pixel portion, plural data lines, plural first scan lines, plural second scan lines, and a current supply line, the pixel portion having pixels arranged in a matrix, the pixels including first light-emitting devices emitting a first color of light, second light-emitting devices emitting a second color of light, and third light-emitting devices emitting a third color of light;

wherein each of the first through third light-emitting devices has the data lines, the first data lines, the second data lines, and first through third transistors;

wherein the first transistors have gate electrodes electrically connected with the first scan lines;

wherein the second transistors have gate electrodes electrically connected with the second scan lines;

wherein the third transistors have gate electrodes electrically connected with any one of source regions and drain regions of the first transistors;

wherein one of the source and drain regions of the third transistors is electrically connected with the current supply lines, while the other is electrically connected with the light-emitting devices;

wherein the first through third light-emitting devices are each disposed parallel to the first scan lines or the second scan lines;

wherein the first through third light-emitting devices are supplied with an electrical current by only one current supply line; and wherein a ratio of light intensities of the first color of light: the second color of light: the third color of light is $\alpha:\beta:\gamma$, and a ratio of emission times of the first light-emitting device: the second light-emitting device: the third light-emitting device is $1/\alpha:1/\beta:1/\gamma$ while the light emitting apparatus displays white color.

According to the present invention, a light emitting apparatus is provided, which has a pixel portion, plural data lines, plural first scan lines, plural second scan lines, and a current supply line, the pixel portion having pixels arranged in a matrix, the pixels including first light-emitting devices emitting red (R), second light-emitting devices emitting green (G), and third light-emitting devices emitting blue (B);

wherein each of the first through third light-emitting devices has the data lines, the first data lines, the second data lines, and first through third transistors;

wherein the first transistors have gate electrodes electrically connected with the first scan lines;

wherein the second transistors have gate electrodes electrically connected with the second scan lines;

wherein the third transistors have gate electrodes electrically connected with either one of source regions and drain regions of the first transistors;

wherein one of the source and drain regions of the third transistors is electrically connected with the current supply lines, while the other is electrically connected with the light-emitting devices;

wherein the first through third light-emitting devices are each disposed parallel to the first scan lines or the second scan lines;

wherein the first through third light-emitting devices are supplied with an electrical current by only one current supply line; and wherein a ratio of light intensities of the first color of light: the second color of light: the third color of light is $\alpha:\beta:\gamma$, and a ratio of emission times of the first light-emitting device: the second light-emitting device: the third light-emitting device is $1/\alpha:1/\beta:1/\gamma$ while the light emitting apparatus displays white color.

According to the present invention, a light emitting apparatus is provided, which has plural pixels arranged in a matrix in N rows and M columns, M data lines, 3N first scan lines, and 3N second scan lines, the pixels including M×3N light-emitting devices each of which emits light of one of first through third colors;

wherein the first through third light-emitting devices are arranged in the same column and each disposed parallel to the first scan lines or the second scan lines; and wherein a ratio of light intensities of the first color of light the second color of light the third color of light is $\alpha:\beta:\gamma$, and a ratio of emission times of the first light-emitting device the second light-emitting device the third light-emitting device is $1/\alpha:1/\beta:1/\gamma$ while the light emitting apparatus displays white color.

In the present invention, light of each of the first through third colors or red (R), green (R), and blue (B) may obtained by passing emitted monochrome light through a color filter or color conversion layer.

In the present invention, the first through third colors or the red (R), green (G), and blue (B) of light may obtained respectively by light-emitting materials which emit the first through third emitted colors or the red (R), green (G), and blue (B) of light.

According to the present invention, a method of driving a light emitting apparatus is provided, the a light emitting apparatus has a pixel portion, plural data lines, plural first scan lines, and plural second scan lines, the pixel portion having pixels arranged in a matrix, the pixels including first light-emitting devices emitting a first color of light, second light-emitting devices emitting a second color of light, and third light-emitting devices emitting a third color of light;

wherein the first through third light-emitting devices are arranged in the same column and each disposed parallel to the first scan lines or the second scan lines;

the method comprising the step of controlling emission times so that a ratio of emission times of the first light-emitting device: the second light-emitting device the third light-emitting device is $1/\alpha:1/\beta:1/\gamma$ while the light emitting apparatus displays white color, providing a ratio of light intensities of the first color of light the second color of light: the third color of light is $\alpha:\beta:\gamma$.

According to the present invention, a method of driving a light emitting apparatus is provided, the light emitting apparatus has a pixel portion, plural data lines, plural first scan lines, and plural second scan lines, the pixel portion having pixels arranged in a matrix, the pixels including first light-emitting devices emitting a first color of light, second light-emitting devices emitting a second color of light, and third light-emitting devices emitting a third color of light;

wherein the first through third light-emitting devices are arranged in the same column and each disposed parallel to the first scan lines or the second scan lines;

the method comprising the steps of:

establishing a frame period corresponding to synchronization timing of a video signal applied from the data lines to the first through third light-emitting devices and plural subframe periods obtained by dividing the frame period, each of the subframe periods having a phase during which the video signal is written to the first through third light-emitting devices, a phase during which the first through third light-emitting devices emit in response to the video signal, and a phase during which the first through third light-emitting devices are ceased to emit; and controlling emission times so that a ratio of emission times of the first light-emitting device: the second light-emitting device: the third light-emitting device is $1/\alpha:1/\beta:1/\gamma$ while the light emitting apparatus displays white color, providing a ratio of light intensities of the first color of light: the second color of light: the third color of light is $\alpha:\beta:\gamma$.

According to the present invention, a method of driving a light emitting apparatus is provided, the light emitting apparatus has a pixel portion, plural data lines, plural first scan lines, and plural second scan lines, the pixel portion having pixels arranged in a matrix, the pixels including first light-emitting devices emitting a first color of light, second light-emitting devices emitting a second color of light, and third light-emitting devices emitting a third color of light;

wherein the first through third light-emitting devices are arranged in the same column and each disposed parallel to the first scan lines or the second scan lines;

the method comprising the steps of:

writing a video signal to the first through third light-emitting devices in any one row in a selected state of the first scan lines;

letting the first through third light-emitting devices emit in response to the video signal; and controlling emission times so that a ratio of emission times of the first light-emitting device: the second light-emitting device: the third light-emitting device is $1/\alpha:1/\beta:1/\gamma$ while the light emitting apparatus displays white color, providing a ratio of light intensities of the first color of light: the second color of light: the third color of light is $\alpha:\beta:\gamma$.

According to the present invention, a method of driving a light emitting apparatus is provided, the light emitting apparatus has a pixel portion, plural data lines, plural first scan lines, and plural second scan lines, the pixel portion having pixels arranged in a matrix, the pixels including first light-emitting devices emitting a first color of light, second light-emitting devices emitting a second color of light, and third light-emitting devices emitting a third color of light;

wherein the first through third light-emitting devices are arranged in the same column and each disposed parallel to the first scan lines or the second scan lines;

the method comprising the steps of:

performing a first step consisting of writing a video signal to the first light-emitting devices;

performing a second step consisting of writing the video signal to the second light-emitting devices;

performing a third step consisting of writing the video signal to the third light-emitting devices;

performing a fourth step consisting of turning off the first light-emitting devices;

performing a fifth step consisting of turning off the second light-emitting devices;

performing a sixth step consisting of turning off the third light-emitting devices;

wherein the video signal is written simultaneously to the first through third light-emitting devices connected with an identical one of the first scan lines;

wherein the turning off is done simultaneously about the first through third light-emitting devices connected with an identical one of the second scan lines; and controlling emission times so that a ratio of emission times of the first light-emitting device: the second light-emitting device: the third light-emitting device is $1/\alpha:1/\beta:1/\gamma$ while the light emitting apparatus displays white color, providing a ratio of light intensities of the first color of light: the second color of light: the third color of light is $\alpha:\beta:\gamma$.

Accordingly, the present invention can provide light-emitting apparatus capable of displaying exact white color by controlling emission times. Further, since the pixel arrangement is provided to be parallel to the gate lines in the present invention, the number of input power supplies can thus be reduced. And, since the number of input power supplies can be reduced, a light emitting apparatus and a driving method therefor in which the burden on the external circuit is reduced and which achieves a high numerical aperture can be provided.

Also, relationships between the pixel and RGB will be elucidated. The pixel is a minimum unit of a matrix display, and is formed by at least three light emitting devices of RGB (also can be called dot) when multicolor display is performed. That is to say, light emitting devices emitting any one of RGB colors of light are formed at each intersection of data lines and scan lines, three neighboring light emitting devices of RGB are gathered and a pixel is formed thereby. Then a plurality of the pixels formed by three light emitting devices of RGB gather and a pixel portion displaying images is formed thereby. However, unless otherwise noted, anyone of RGB, that is, circuits formed by transistors, light emitting devices, capacitors and the like at each intersection of data lines and scan lines is called pixels for convenience.

BRIEF DESCRIPTION OF THE DRAWINGS

FIGS. 2A–2B are diagrams illustrating the difference in order of writing a video signal between a related art example and the present invention;

FIG. 7 is a diagram showing an example of configuration of a data line driver circuit;

FIG. 8 is a diagram showing an example of configuration of a writing scan line driver circuit;

DESCRIPTION OF THE PREFERRED EMBODIMENTS

Mode for Carrying out the Invention

In the present mode, an example is described in which all pixels are formed using light-emitting devices emitting white light in a light emitting apparatus and the light transmittances of colored layers of red (R), green (G), and blue (B) are $R_R:R_G:R_B=\alpha:\beta:\gamma(\alpha>\beta>\gamma)$.

Figure 1A:
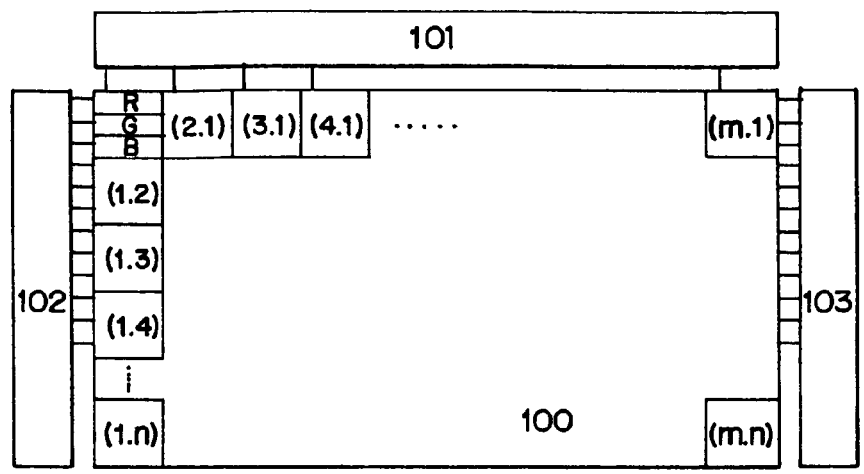
FIGS. 1A and 1B are diagrams showing an outline of a light emitting apparatus of the present invention and an equivalent circuit of its pixel portion.
Figure 1B:
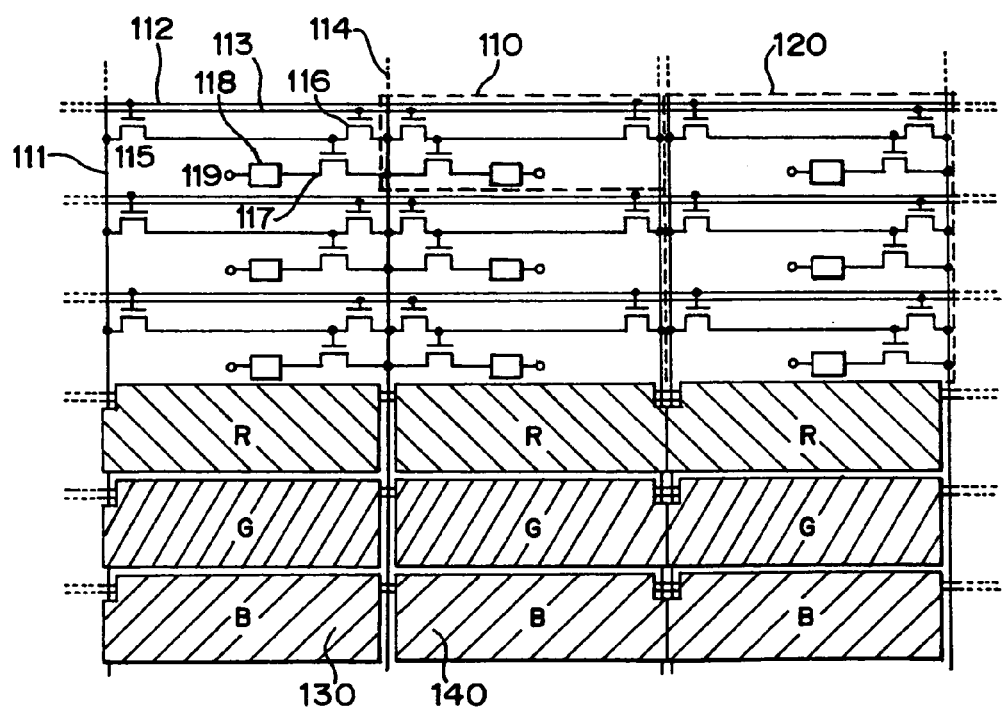

FIG. 1A schematically shows the configuration of a panel that is the body of display apparatus. The panel has a data line driver circuit 101 over a pixel portion 100 positioned in the center. The panel has a writing scan line driver circuit 102 and an erasing scan line driver circuit 103 on the left and right sides, respectively. As shown in FIG. 1B, each pixel has a data line 111 to which a video signal (electrical signal) is applied, a first scan line (writing scan line) 112 to which a writing gate signal is applied, a second scan line (erasing scan line) 113 to which an erasing gate signal is applied, a current supply line $(V_{(A)})$ 114, a first thin-film transistor (switching TFT) 115 used for switching, a second thin-film transistor (TFT for erasure) 116 used for erasure, a third thin-film transistor (driver TFT) 117 used to drive a light-emitting device, the light-emitting device 118, and a counter electrode 119. A capacitive unit (not specifically shown in FIG. 1B) may be provided to retain the voltage between the gate and source of the driver TFT 117. Note that the pixel configuration of the present invention is not limited to thin-film transistors. It may be semiconductor devices. In the following description, thin-film transistors (TFTs) are taken as an example.

One electrode (pixel electrode) of the light-emitting device 118 is connected with a source region or drain region of the driver TFT 117. A potential having a potential difference with the current supply line $(V_{(A)})$ 114 is impressed on the other electrode (counter electrode).

A method of driving the circuit of the present invention is next described based on FIGS. 1A, 1B and 2B–2D. In the following description, the TFTs have the following polarities as an example. The switching TFT 115 and erasing TFT 116 are of N-channel type, while the driver TFT 117 is of P-channel type. The electrode connected with the source region or drain region of the driver TFT 117 is an anode, while the counter electrode is a cathode in the light-emitting device 119.

First, during an addressing (writing) period, a pulse is applied to the writing scan line 112, producing an H level. The switching TFT 115 is turned ON. The video signal output to the data line 111 is applied to the gate electrode of the driver TFT 117.

Subsequently, during a sustain (emission) period (display period), the driver TFT 117 is turned ON. As a result, the potential difference between the potential at the current supply line 114 and the potential at the counter power line causes an electrical current to flow through the light-emitting device 118, producing light. When the driver TFT 117 is OFF, no current flows through the light-emitting device 118 and hence it does not emit.

Subsequently, during a reset period, a pulse is applied to the erasing scan line 113, producing an H level. The erasing TFT 116 is turned ON. As the erasing TFT 116 is turned ON, the voltage between the gate and source of the driver TFT 117 becomes zero. The driver TFT 117 is turned OFF. The emitting light-emitting device 118 is ceased to emit. After this driver TFT 117 is turned OFF, it is an erasure period during which the light-emitting device 118 does not emit light.

The reset operation is performed every erasing scan line, i.e., every row. Therefore, the emission time controlled by the reset operation is uniform over all the pixels connected to a certain erasing scan line. In the present invention, the brightnesses of RGB are adjusted by controlling the emission time of the light-emitting device 118 during the sustain period. Therefore, in order to control the emission times for R, G, and B separately, rows for RGB are arranged parallel to the erasing scan lines as shown in FIG. 1B. At this time, pixels in N rows×M columns are composed of light-emitting devices in 3N rows×M columns. Furthermore, since the writing scan lines are laid parallel to the erasing scan lines, it can also be expressed that the columns for RGB are positioned parallel to the writing scan lines. Therefore, arranging the columns for RGB parallel to the erasing scan lines or writing scan lines is simply referred to as arranging the columns for RGB parallel to the scan lines.

Because the columns for RGB are arranged parallel to the scan lines, there are only one data line, one writing scan line, and one erasing scan line per dot. Furthermore, a current supply line can be shared between adjacent pixels. This is more advantageous in terms of numerical aperture than image display apparatus disclosed in JP-A-2001-60076. Since the RGB are arranged parallel to the scan lines, the writing scan lines are equal in number with the erasing scan lines. Therefore, driving based on the same clock signal is enabled. Consequently, subsequent control of the emission times is easy.

Writing of an input signal to the pixel portion in which RGB are arranged as in the present invention is described below.

FIG. 2A is an example in which RGB are arranged in a vertical direction. Pixels in N rows and M columns are composed of light-emitting devices in N rows and 3M columns. In this case, writing to one pixel is completed by writing to three dots of RGB (indicated by the dotted frame in FIG. 2B). Writing (indicated by the dotted frame in FIG. 2B) for one row (M pixels=3M dots) requires one horizontal period.

FIG. 2B is an example in which RGB are arranged in a lateral direction.

Pixels in N rows and M columns are composed of light-emitting devices in 3N rows and M columns. In this case, writing to one pixel is completed by writing to three dots of RGB (indicated by the dotted frame in FIG. 2D). Writing (indicated by the dotted frame in FIG. 2D) for one row (M pixels=3M dots) requires three horizontal periods. The number of light-emitting devices that write is identical for both cases. Therefore, the length of the former one horizontal period and the length of the latter three horizontal periods are almost equal.

Figure 4A:
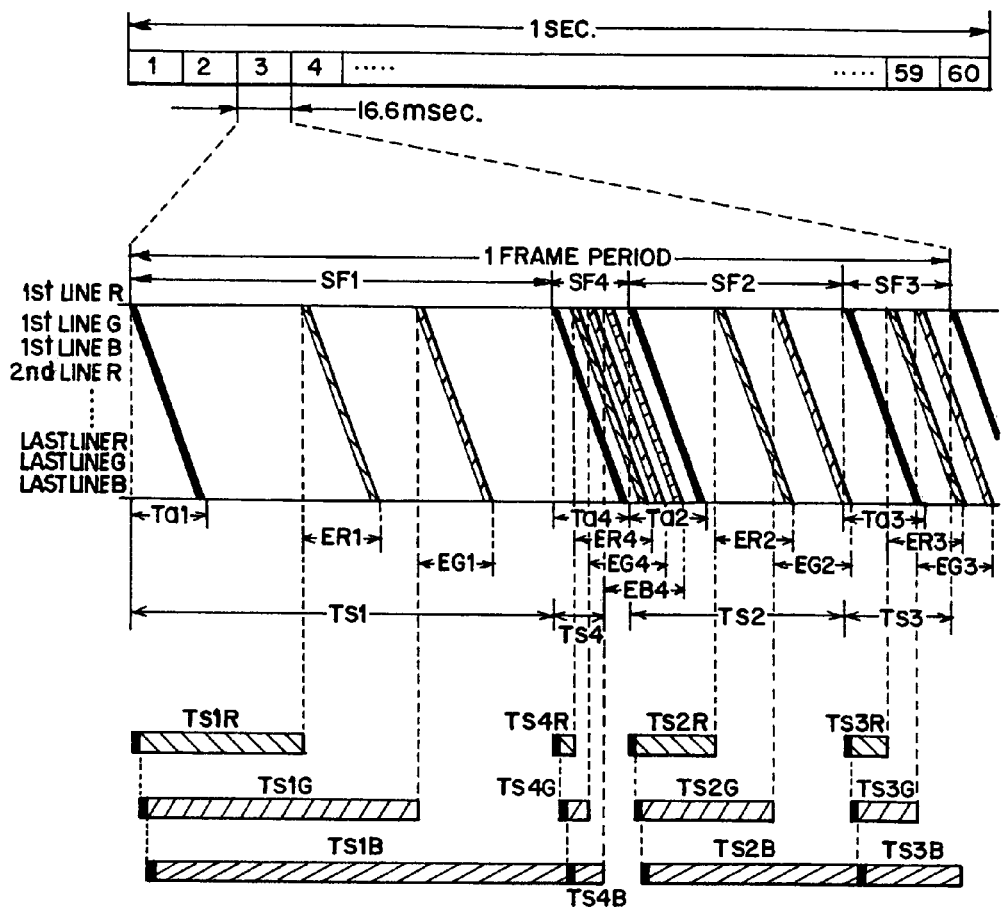
FIGS. 4A and 4B are diagrams showing a timing chart in a case where a 4-bit color display is provided by implementing the invention.

FIG. 4 shows a timing chart on the whole operation. Where an image or picture is displayed in the light emitting apparatus, the image screen is displayed plural times during one second. At this time, to prevent rewriting of the image screen from being perceived as flicker, it is considered that it is necessary to rewrite the screen about 60 times per second as shown in FIG. 4A.

Furthermore, in the present invention, the time gradation system is adopted and so one frame period is divided into plural subframe periods. Each subframe period has an addressing (writing) period, a sustain (emission) period, a reset period, and an erasure period. The length of emission time is made different among subframe periods. Gradation is accomplished by combinations of subframe periods during which light is emitted. In the example shown in FIG. 4A, the number of gray levels is set to 4 bits. One frame period is divided into four subframe periods SF1 to SF4. The lengths of the sustain periods Ts1 to Ts4 that the subframe periods have are given by ratios of powers of 2 such as Ts1:Ts2:Ts3:Ts4=8:4:2:1. In this way, a linear gradation is obtained. Of course, these ratios are not always limited to powers of 2 in expressing a gradation.

In FIG. 4A, the order of the subframe periods within one frame period has been changed, because overlaps of addressing (writing) periods and reset periods of different subframe periods should be avoided. The order in which subframe periods appear is not limited to this.

Figure 4B:
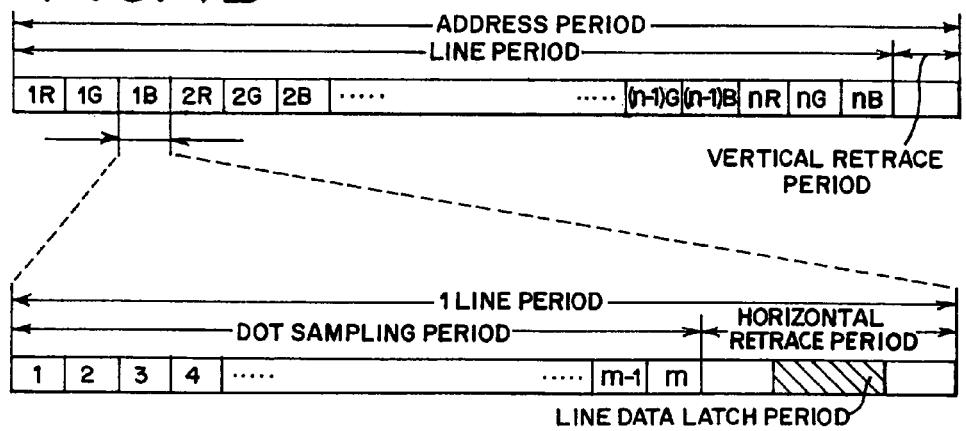

First, during addressing period Ta1 at SF1, a video signal (electrical signal) is written over one screen of image as shown in FIG. 4B. At this time, the writing order is as follows: first column R→first column G→first column B→second column R→ . . . →final column R→final column G→final column B.

Then, it goes to a sustain period (emission time). Emission times $T_R$, $T_G$, and $T_B$ for R, G, and B are so set that $T_R:T_G:T_B$ $(\gamma/\alpha):(\gamma/\beta):1$, i.e.,$(1/\alpha):(1/\beta):(1/\gamma)$. In this way, reset and erasure periods are established according to different colors. As shown in FIG. 4A, the reset operation is performed. First, during reset period ER1, erasing is done over one frame of image only about emitting devices for R. Then, during reset period EG1, erasing is done over one frame of image only about light-emitting devices for G. That is, the emission times for R and G are increased by factors of $(\gamma/\alpha)$ and $(\gamma/\beta)$ based on that of the light-emitting devices for B with the lowest light transmittance. Consequently, the brightnesses after transmission are increased by factors of $(\gamma/\alpha)$ and $(\gamma/\beta)$, respectively. The brightnesses after transmission can be made uniform over RGB. By controlling the emission times in this way, the brightnesses after transmission through the colored layers can be made uniform over RGB.

Where the sustain period (emission time) Ts4 is shorter than the addressing period Ta4 such as subframe period SF4 in FIG. 4A, erasing is done also for light-emitting devices for B and so there is reset period EG4.

Also, in the present embodiment, where the light transmittance of the B colored layer is low, the emission times for R and G are shortened in the foregoing description. The present invention is not limited to the method of matching the emission times for R and G to B. Rather, the invention is characterized in that the emission times are matched to the emission time for a color with the lowest light transmittance.

The timing at which the emission times for RGB are controlled by the reset and erasure periods can be determined by rotating a counter by a gate side clock signal applied to a writing scan line driver circuit during a writing period and using the count number.

That is, the erasing scan lines are operated during the erasure periods based on the clock signal on the writing scan lines, and the emission times for RGB can be determined and controlled.

Accordingly, in the present invention, the clock signal for the writing TFTs can be used as the clock signal for the erasing TFTs. Therefore, the invention has another advantage that it is easy to match the timing of the writing scan line driver circuit and the timing of the erasing scan line driver circuit.

Where the emission times are not set to multiple integrals of the count of the gate clock signal using the ratios (e.g., $(\gamma/\alpha)$ and $(\gamma/\beta)$) of the light transmittances of the colored layers, it is obvious that appropriate integers may be approximated. Based on this, the emission times for red (R), green (G), and blue (B) may be determined and controlled.

In the present embodiment, a case where light transmits through the colored layers has been described. The technical concept of the present invention consisting of controlling emission times can also be applied to cases where different colors of light are emitted from a light-emitting device itself.

EMBODIMENTS

Embodiment 1

Figure 9:
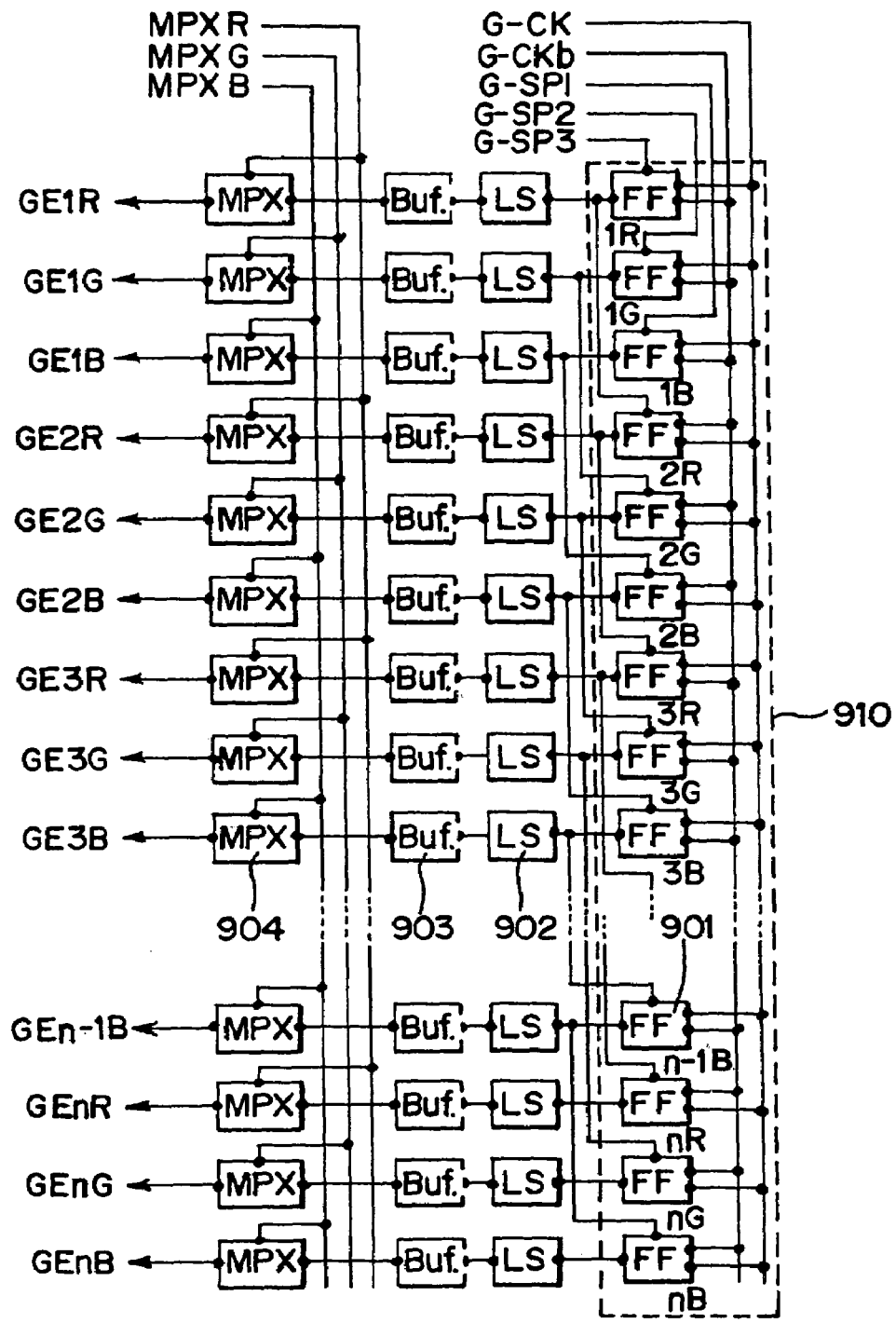
FIG. 9 is a diagram showing an example of configuration of an erasing scan line driver circuit.

FIGS. 7, 8, and 9 schematically show driver circuits for implementing the operations described above. FIG. 7 is an example of the data line driver circuit. FIG. 8 is an example of the writing scan line driver circuit. FIG. 9 is an example of the erasing scan line driver circuit.

In FIG. 7, the data line driver circuit includes a shift register 710 using plural stages of flip-flops 701, a first latch circuit 702, a second latch circuit 703, a level shifter 704, and a buffer 705.

The shift register 710 delivers sampling pulses successively according to a clock signal (S-CK), a clock-inverted signal (S-CKb), and a start pulse (S-SP).

Subsequently, the first latch circuit 702 successively accepts digital video signals (digital data) according to input of the sampling pulses. When the first latch circuit 702 in the final stage completes acceptance of the digital video signals, a latch pulse is applied during a horizontal retrace period. The digital video signals held in the first latch circuit 702 are simultaneously transferred to the second latch circuit 703.

Then, the level shifter 704 performs a voltage-to-amplitude conversion. The signals are amplified by the buffer 705 and output to data lines $S_1$ to $S_m$, respectively.

In FIG. 8, the writing scan line driver circuit has a shift register 810 using plural stages of flip-flops 801, a level shifter 802, and a buffer 803.

The shift register 810 delivers pulses in turn according to a clock signal (G-CK), a clock-inverted signal (G-CKb), and a start pulse (G-SP).

Figure 10:
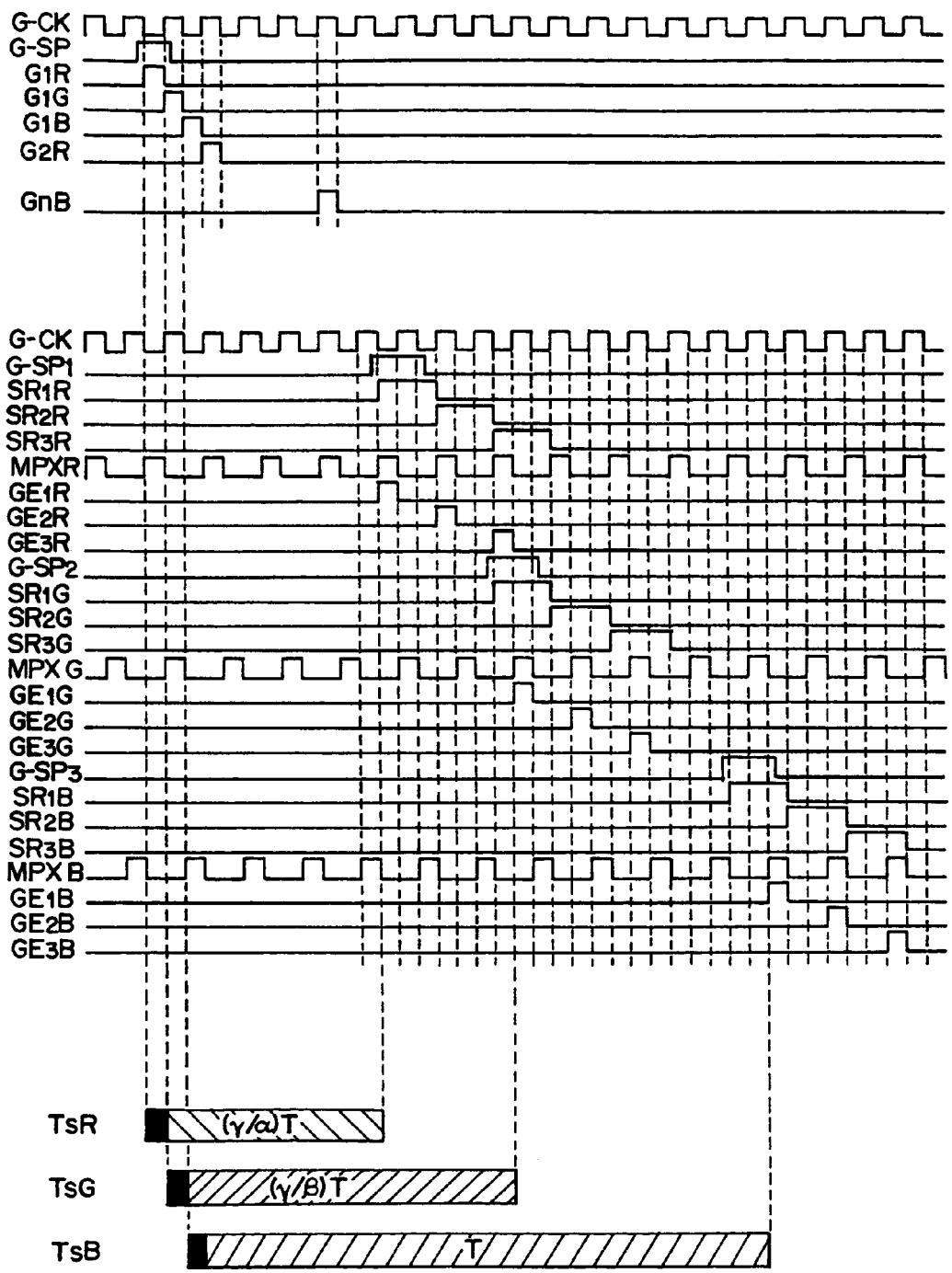
FIG. 10 is a diagram showing an addressing (writing) period, a reset period, and emission times for emitted colors of light.

Then, the level shifter 802 performs a voltage-to-amplitude conversion. The signals are amplified by the buffer 803. Writing scan lines $G_1R$, $G_1G$, $G_1B$, etc. are selected in turn. In the selected columns, the aforementioned video signals are written. The timing at which the writing scan lines are selected at this time, i.e., the timing in the addressing (writing) period, is shown in FIG. 10 (upper). In FIG. 10 (upper), $G_1R$, $G_1G$, $G_1B$, $G_2R$, . . . , $G_nB$ are pulses for selecting writing scan lines, respectively.

In FIG. 9, the erasing gate signal driver circuit has a shift register 910 using plural stages of flip-flops 901, a level shifter 902, a buffer 903, and a multiplexer 904.

Three kinds of start pulses (G-SP$_1$, G-SP$_2$, and G-SP$_3$) are applied to the shift register 910. That is, the shift register 910 has three phases using a common clock signal. Pulses are successively delivered from stages 1R, 2R, 3R, etc. according to the clock signal and G-SP$_1$. Pulses are successively delivered from stages 1G, 2G, 3G, etc. according to the clock signal and G-SP$_2$. Pulses are successively delivered from stages 1B, 2B, 3B, etc. according to the clock signal and G-SP$_3$. In this way, erasing scan lines are selected at independent timings for RGB and reset periods can be set. Subsequently, conversion to amplitude is performed by the level shifter 902. The pulses are amplified by the buffer 903 and cause the multiplexer 904 to select erasing scan lines at desired timing. The timing at which erasing scan lines are selected at this time, i.e., the timing in the reset period, is shown in FIG. 10 (middle). In FIG. 10 (middle), $SR_1R$, $SR_2R$, $SR_3R$, etc., $SR_1G$, $SR_2G$, $SR_3G$, etc., and $SR_1B$, $SR_2B$, $SR_3B$, etc. are pulses delivered from the shift register. $GE_1R$, $GE_2R$, $GE_3R$, etc., $GE_1G$, $GE_2G$, $GE_3G$, etc., and $GE_1B$, $GE_2B$, $GE_3B$, etc. are pulses for selecting erasing scan lines. MPX R, MPX G, and MPX B are signals applied to the multiplexer. The timing at which erasing scan lines are selected is determined.

The sustain periods (emission times) TsR, TsG, and TsB for RGB are determined as shown in FIG. 10 (lower) depending on the addressing (writing) period shown in FIG. 10 (upper) and on the reset period shown in FIG. 10 (middle). For TsR, TsG, and TsB, the timing in the pixels of the first column is shown. It can be seen that the timing of the end of each emission time is determined by the timing at which the start pulses (G-SP$_1$ to G-SP$_3$) are applied to the erasing scan line driver circuit. At this time, the ratios of the emission times are $(\gamma/\alpha):(\gamma/\beta):1$, it being noted that the aforementioned transmittances of the colored layers are $\alpha:\beta:\gamma$. As the apparent brightness can be made uniform over RGB, exact white color can be displayed.

Embodiment 2

In the present embodiment, color filters are used as specific colored layers. An example in which the light transmittances of the color filters for RGB are $R_R:R_G:R_B=30\%:50\%:20\%$ is described.

Figure 5A:
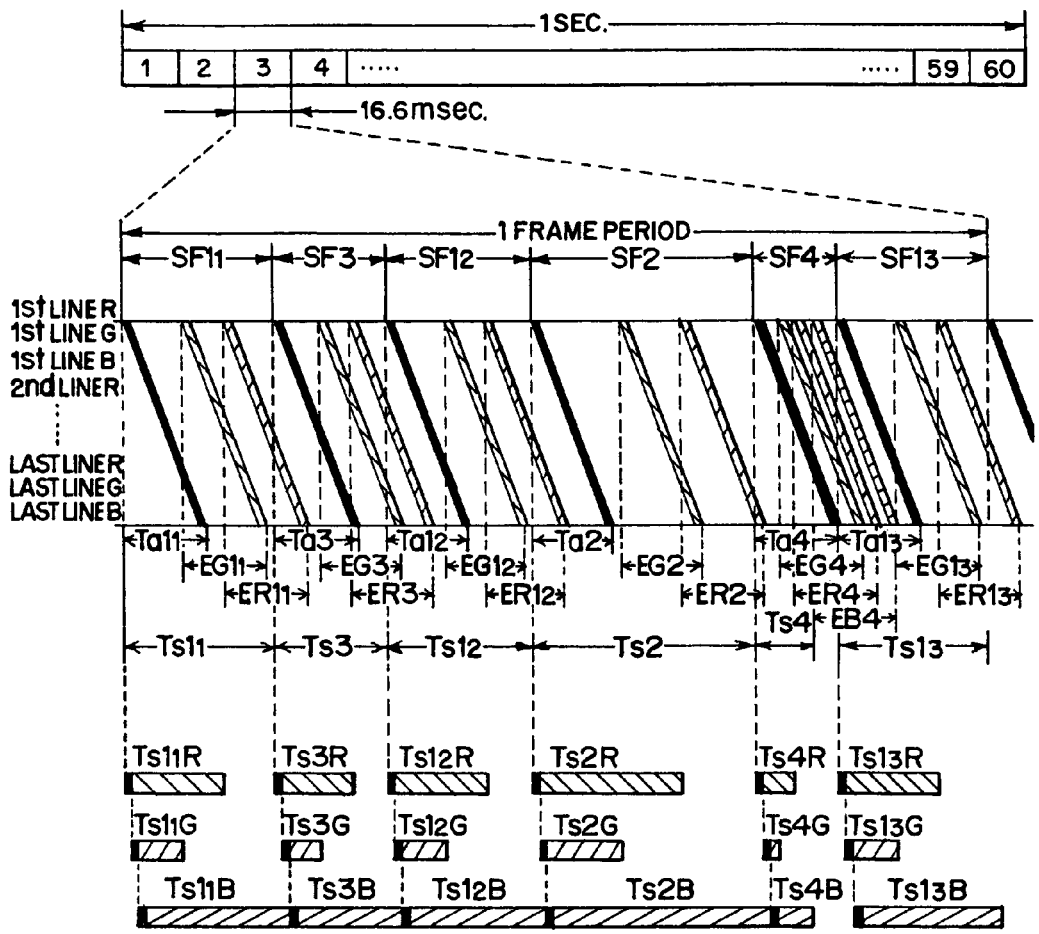
FIGS. 5A and 5B are diagrams showing a timing chart in a case where a 4-bit color display is provided by implementing the invention.
Figure 5B:
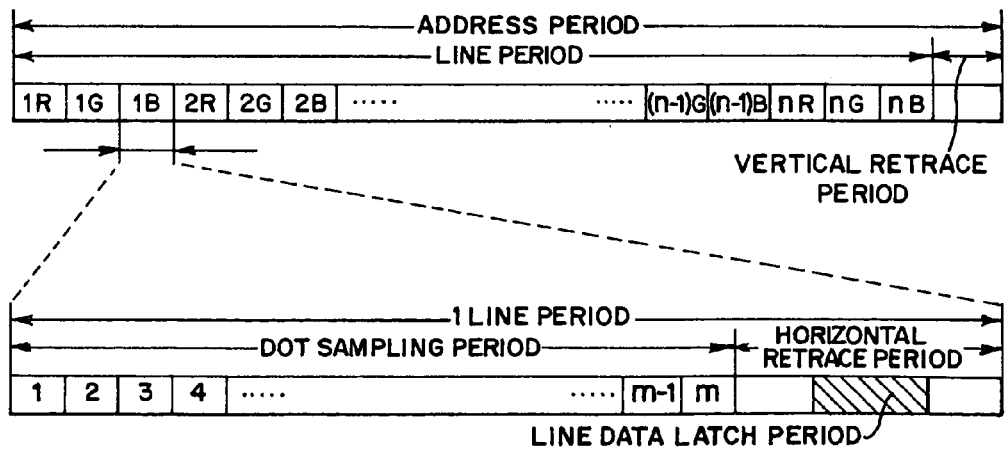

Referring to FIGS. 5A and 5B. In the present embodiment, 60 frame periods are established per second and a 4-bit gradation is displayed in the same way as in the mode described above. In Embodiment 1, 1 frame period is equal to the number of displayed bits and divided into four subframes SF$_1$ to SF$_4$. Here, SF1 corresponding to the highest-order bit is further divided into three, i.e., SF1$_1$, FF1$_2$, and SF1$_3$. They are so arranged that they are not successive to each other. This is a measure to prevent generation of false contouring when intermediate gray levels are displayed on an EL display or the like. Details of false contouring and a procedure for solution are applied for a patent by the present applicant as Japanese patent application No. 2001-257163. In SF1$_1$, SF1$_2$, and SF1$_3$, similar video signals are applied. Therefore, either all the light-emitting devices emit or none of them emit.

Furthermore, in the same way as in the mode described above, the order in which subframes appear is made different among different subframe periods to prevent overlaps of addressing periods (writing) periods or reset periods. That is, if subframe periods having long sustain (emission) periods and subframe periods having short sustain (emission) periods are made to appear alternately, the above-described problem will be unlikely to occur.

Each of subframes SF1 to SF4 has an addressing (writing) period and a sustain (emission) period. Here, the light transmittance of the color filter for blue (B) has the lowest value of 20% and so the brightness of blue (B) is lowest. Accordingly, the emission times for red (R) and green (G) are controlled based on the emission time for blue (B).

The emission times for red (R) and green (G) are controlled using the erasure period such that they are 67% and 40%, respectively, of the emission time for blue (B). The emission times may be determined based on the ratio $R_R:R_G:R_B=30\%:50\%:20\%$ of the light transmittances of the color filters. Since the brightness of blue (B) passed through the color filter has the lowest light transmittance, SF1 to SF3 have erasure periods only for red (R) and green (G). That is, the emission time for blue (B) with the lowest brightness is utilized maximally.

SF4 has erasure periods for red (R), green (G), and blue (B), respectively, for the following reason. The period of SF4 is short. Overlap of the addressing period of SF4 and the addressing period of the next SF2 is prevented. When intermediate gray levels are displayed, production of dynamic false contouring is prevented.

Embodiment 3

In the present embodiment, an example in which the present invention is carried out by a driving method different from the above-described mode and Embodiments 1 and 2 is described.

One of methods for driving active matrix display devices is the field sequential system. This is a drawing method making use of the limitation of the time resolution of the human eye. A color image is divided into different types of color information for RGB. Images are created in succession according to the colors. That is, during one frame, an image consisting only of R, an image consisting only of G, and an image consisting only of B are displayed in this order. In this case, during the instant when an image of R is being displayed, images of G and B are not displayed but the images of the various colors are made to overlap for the human eye by the after-image effects. As a result, the images are captured as a color image.

The method of the present embodiment operates similarly to the method described above. Simply speaking, during an addressing (writing) period, writing of only R is first done. Then, G is written. Finally, B is written. In this way, emitted colors of light are separately written. After desired emission times for the emitted colors of light elapse, erasing operations are performed similarly. Since the sustain (emission) periods for the emitted colors of light overlap each other, this system is different from the field sequential system in a strict meaning. Here, for convenience, this system is referred to as the field sequential system.

A specific circuit configuration and operation is described. Since the data line driver circuit is similar in configuration and operation with the above-described mode and Embodiments 1 and 2, its description is omitted here.

Figure 11:
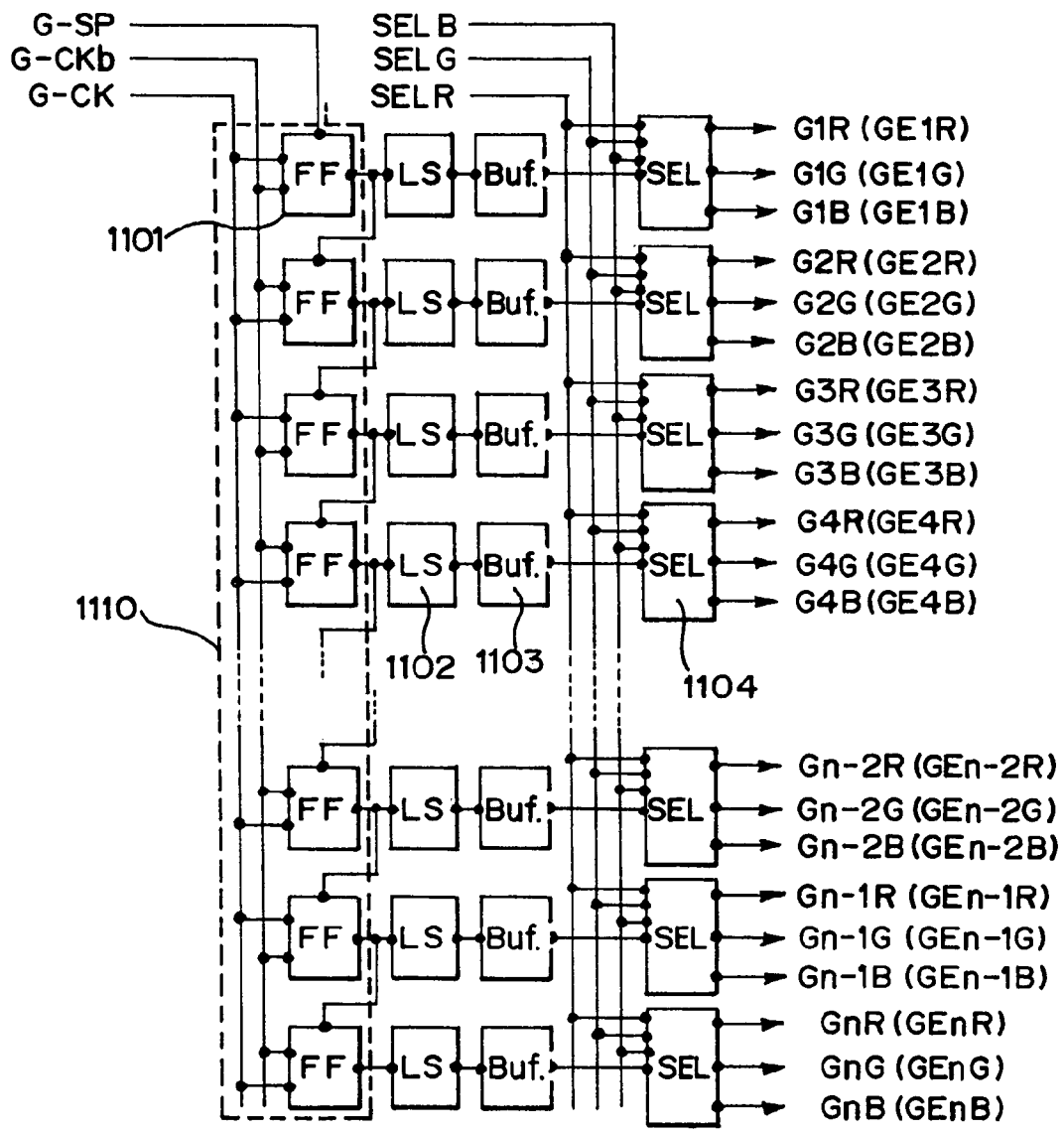
FIG. 11 is a diagram showing an example of configuration of a writing (or erasing) scan line driver circuit.

FIG. 11 shows an outline of the configuration of the scan line driver circuit. In the present embodiment, the writing scan line driver circuit and erasing scan line driver circuit can be similar in configuration. In the same way as the writing scan line driver circuit shown in FIG. 8, the scan line driver circuit has a shift register 1110 using plural stages of flip-flops 1101, a level shifter 1102, and a buffer 1103. Furthermore, it has selector circuits 1104.

Figure 12:
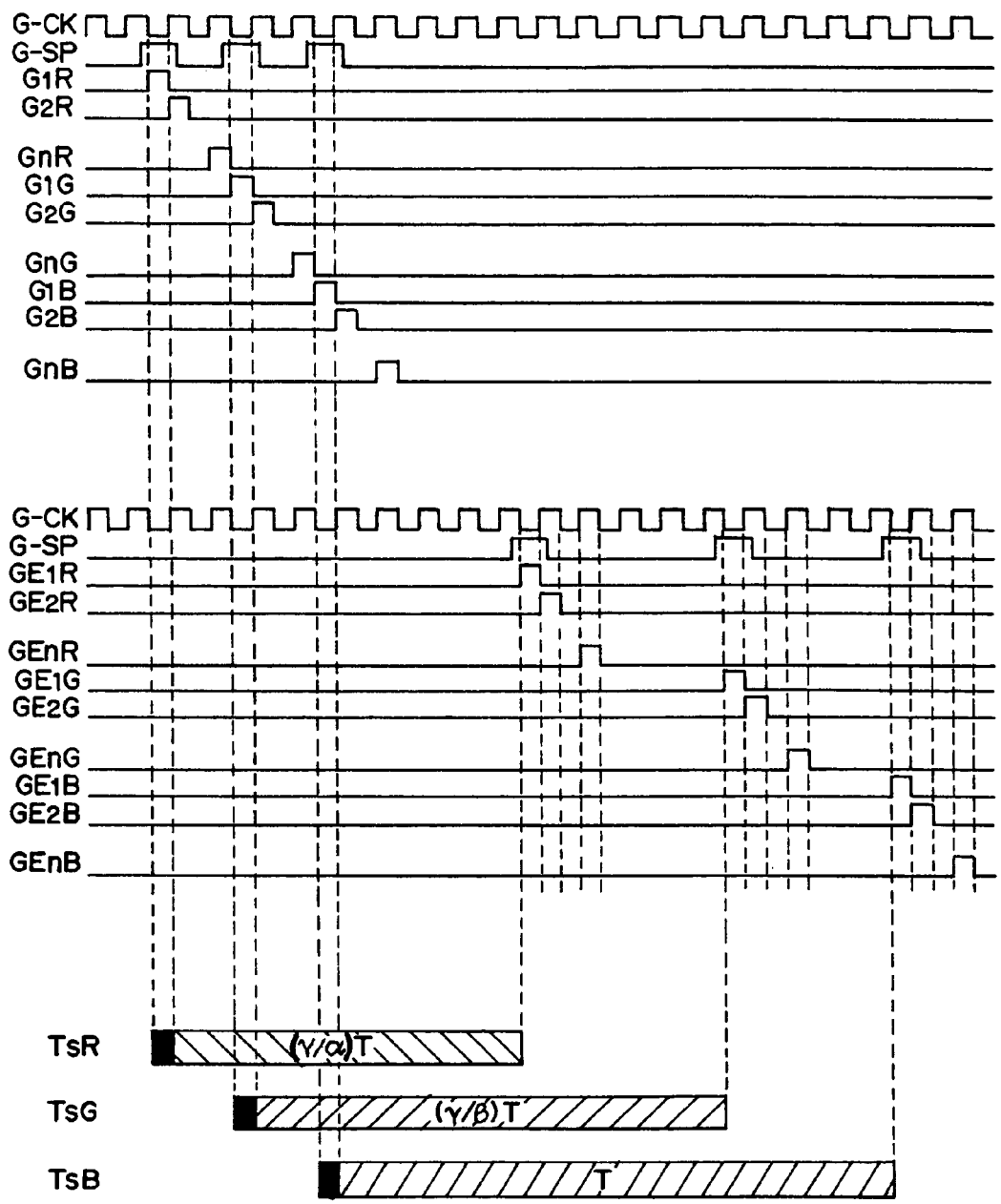
FIG. 12 is a diagram showing an addressing (writing) period, a reset period, and emission times for emitted colors.

The operation from the shift register to the buffer is the same as the operation of the writing scan line driver circuit in Embodiment 1. Pulses are successively output according to a clock signal, a clock-inverted signal, and a start pulse. Here, each one of the selector circuits 1104 is disposed for each output stage from the shift register 1110. Three writing scan lines corresponding to RGB are connected with one selector circuit 1104. The selector circuit 1104 divides an addressing (writing) period into former, middle, and latter phases. In each phase, different writing scan lines are selected, and a pulse from the shift register is output. For example, in the former phase, writing scan lines corresponding to R are selected. $G_1R, G_2R, G_3R, \ldots, G_nR$ are successively selected. In this way, a video signal is written. In the middle phase, writing scan lines corresponding to G are selected. $G_1G, G_2G, G_3G, \ldots, G_nG$ are successively selected. In this manner, a video signal is written. In the latter phase, writing scan lines corresponding to B are selected. $G_1B, G_2B, G_3B, \ldots, G_nB$ are successively selected. In this manner, a video signal is written. This situation is illustrated in FIG. 12 (upper). The start pulse is applied three times during one addressing (writing) period.

Similarly, after passage of desired emission times for RGB, erasing operations are performed. The operations are similar to the operations of the writing scan line driver circuit.

Because of the operations described thus far, the emission times for RGB are controlled. Where writing and erasing are done according to FIG. 12 (upper and middle), emission times for the colors are as shown in FIG. 12 (lower).

As an example, an example of the whole timing is shown in FIG. 6. In this case, the light transmittances of the color filters are set to $R_R:R_G:R_B=30\%:50\%:20\%$, and the operation is performed by the field sequential system, in the same way as in Embodiment 2.

Where the light transmittances are as described above, the emission times for red (R) and green (G) are 67% and 40%, respectively, of the emission time for blue (B). Where an erasing operation is effected with the driver circuit of the structure shown in FIG. 11, it is impossible to make erasure periods for different colors overlap each other within the same subframe period. Therefore, writing and erasing operations are preferably carried out in such an order that a color with the shortest emission time comes first and a color with the longest emission time comes last.

Figure 6A:
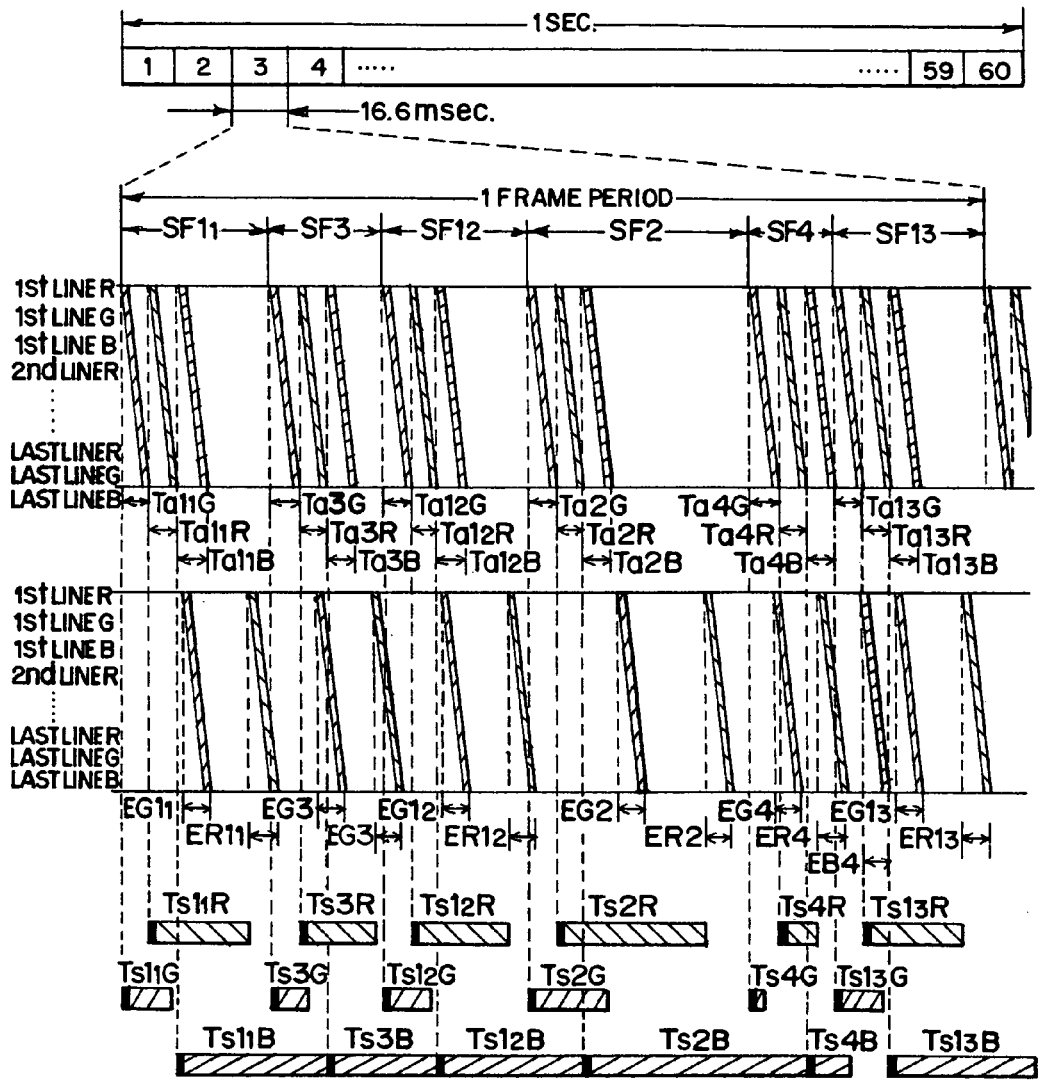
FIGS. 6A and 6B are diagrams showing a timing chart in a case where a 4-bit color display is provided by implementing the invention.

As shown in FIG. 6A, the order in which the emitted colors of light are written during an addressing (writing) period is such that G→R→B. In this way, a color with a shorter emission time comes earlier. That is, a color for which writing has been completed earlier has a shorter emission time than a color written later and thus will be inevitably erased at earlier timing. In consequence, overlaps of erasing operations for RGB can be circumvented as much as possible.

Of course, if the erasing scan line driver circuit is designed differently from FIG. 11 (e.g., the configuration as shown in FIG. 9 and described in Embodiment 1), overlaps of erasure periods are permissible. However, where the configuration shown in FIG. 11 is used and the method is the driving method described in the present embodiment, the structure of the erasing gate signal driver circuit can be made simpler.

Figure 6B:
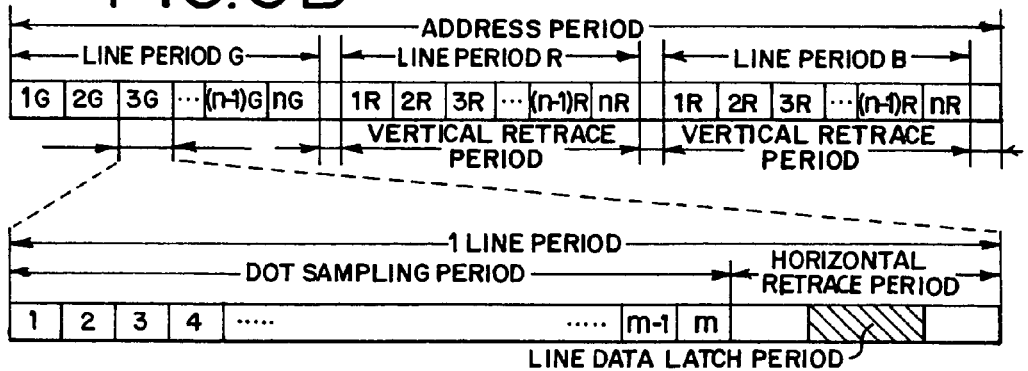

It can be seen that the writing timing shown in FIG. 12 (upper) is divided into three line periods according to different emitted colors of light within one addressing period as shown in FIG. 6B.

Embodiment 4

Figure 3:
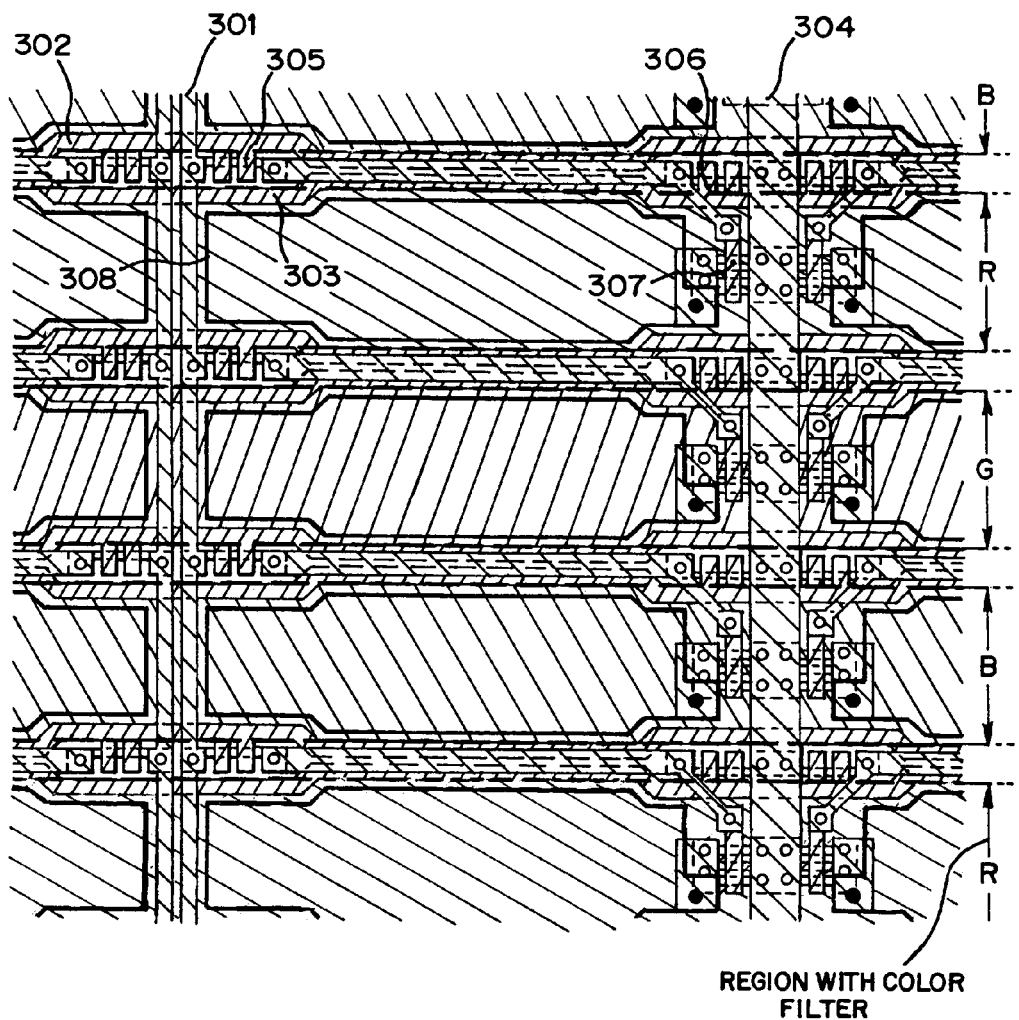
FIG. 3 is a diagram showing an example of layout of the pixel portion shown in FIG. 1B.

FIG. 3 shows an example in which pixels of the circuit configuration shown in FIG. 1B are actually laid out. In the figure, 301 is a data line, 302 is a writing scan line, 303 is an erasing scan line, and 304 is a current supply line shared by adjacent light-emitting devices. 305 is a switching TFT. 306 is an erasing TFT. 307 is a driver TFT. 308 is a pixel electrode. Emissive layers and a counter electrode are omitted. Switching TFTs 305 and erasing TFTs 306 are double-gate TFTs. They may also be single-gate TFTs or multi-gate (three or more gated) TFTs.

In the present embodiment, no specific retaining capacitors are mounted. During a sustain period, the voltage between the gate and source of the driver TFT 307 is held by the channel capacitance and gate capacitance of the driver TFT 307 itself.

Color filters and color conversion layers are applied like stripes in a horizontal direction with respect to the writing scan lines. Since light-emitting devices adjacent in the left and right direction emit light of the same color, they do not need to be patterned.

Embodiment 5

Figure 13:
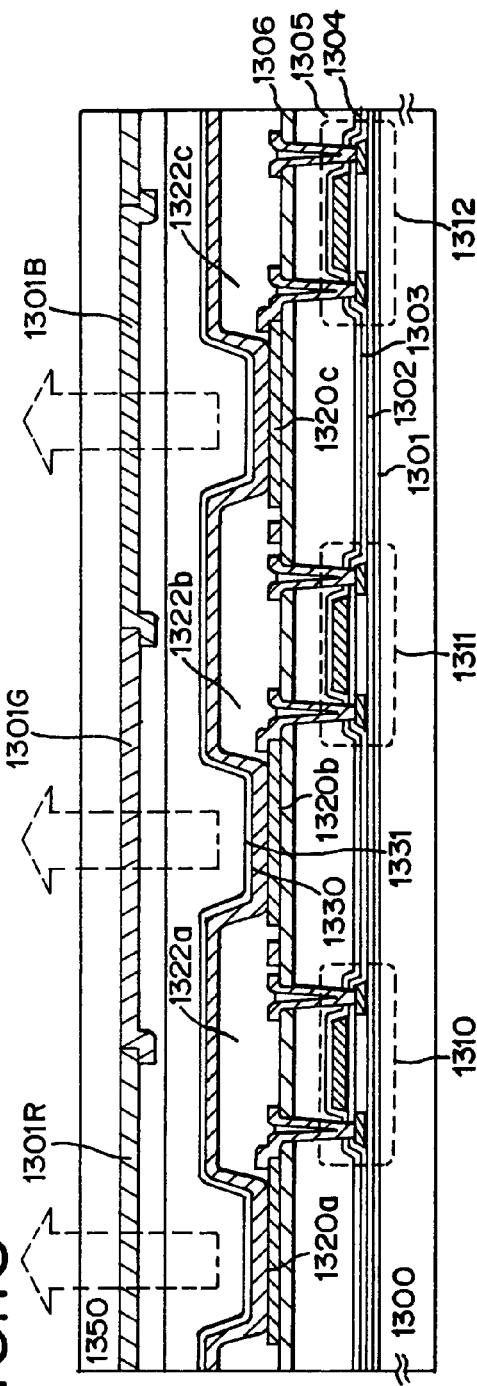
FIG. 13 is a view showing a cross-sectional structure of a light-emitting device.

In the present embodiment, a cross-sectional structure of the light emitting apparatus of the present invention is briefly described using FIG. 13. For simplicity of illustration, desiccant and other structures are omitted, although cross-sectional structures of driver TFTs and light-emitting devices are shown in FIG. 13, as well as color filters that are RGB colored layers.

In FIG. 13, 1300 is a substrate having an insulating surface. Driver TFTs 1310 to 1312 are formed on the substrate 1300. Semiconductor films and gate electrodes that are constituent members of TFTs are formed on the substrate 1300. In addition, a first insulator film 1301 and a second insulator film 1302 acting as blocking layers, a third insulator film 1303 acting as a gate insulator film, a fourth insulator film 1304 acting as a passivation film, a fifth insulator film 1305 acting as an interlayer dielectric film, and a sixth insulator film 1306 acting as a blocking layer are formed from the substrate side. Where the interlayer dielectric film is made of an organic material, the sixth insulator film acts to prevent degassing.

Conductive interconnects are formed and connected with doped regions formed in active layers possessed by the driver TFTs 1310–1312. First electrodes 1320a–1320c are formed and connected with the conductive interconnects. Partition walls 1322a–1322c are formed to cover the first electrodes and conductive interconnects. The side surfaces of the partition walls are formed at an angle of 30 to 70 degrees. Auxiliary conductive interconnects may be formed on the partition walls 1322a–1322c to reduce the resistance of the first electrode.

An organic thin film (emissive layer) 1330 is formed to cover the partition walls 1322a–1322c and the first electrodes 1320a–1320c. A second electrode 1331 is formed on the organic thin film (emissive layer) 1330. The material of this second electrode 1331 should be so selected that it transmits light emitted by the organic thin film (emissive layer). For example, the electrode is made of ITO. The laminate of the first electrodes 1320a–1320c, organic thin film (emissive layer) 1330, and second electrode 1331 corresponds to a light-emitting device.

Color filters 1301R, 1301G, and 1301B that are given colored layers corresponding to light-emitting devices are formed on a counter electrode 1350 located opposite to the substrate 1300. This substrate 1300 and the counter substrate 1350 are bonded together, thus forming a light emitting apparatus.

In the light emitting apparatus as in FIG. 13, light emitted from the light-emitting devices is directed away from the substrate 1300 (in the direction of the arrows of FIG. 13). The light passes through the color filters 1301R, 1301G, and 1301B, thus enabling multicolor display. This case where light is emitted away from the substrate is referred to as "top surface emission". In the case of top surface emission, the first electrode corresponds to a cathode, while the second electrode corresponds to an anode.

Embodiment 6

Figure 14:
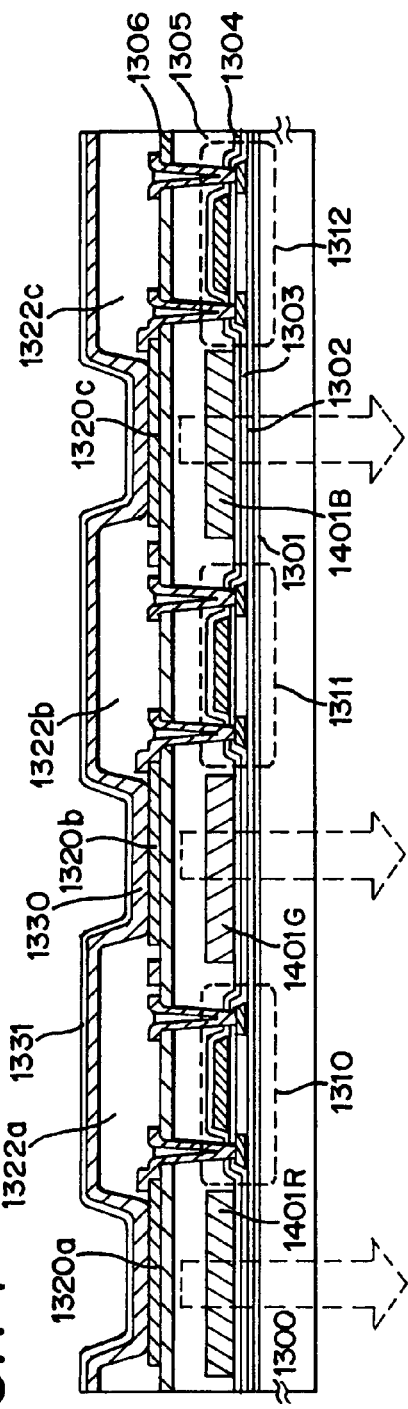
FIG. 14 is a view showing a cross-sectional structure of a light-emitting device.

In the present embodiment, other cross-sectional structure of the light emitting apparatus of the present invention is briefly described using FIG. 14. In FIG. 14, for locations corresponding to those of FIG. 13, identical numerals are used.

One feature of the present embodiment is that the position where the color filters 1401R, 1401G, and 1401B that are given colored layers corresponding to light-emitting devices are formed is below the first electrodes. In FIG. 14, the colored layers are formed in contact with the top surface of the fourth insulator film 1304. The location is not limited to this. That is, it suffices that the colored layers are under the first electrodes. The installation location may be set appropriately.

This is due to the structure in which light emitted from the light-emitting devices in the a light emitting apparatus of FIG. 14 is directed toward the substrate 1300 (in the direction of the arrows of FIG. 14). Therefore, the material of the second electrodes should be so selected that it transmits the light emitted from the organic thin film (emissive layer). For example, it is made of ITO. This case where light is emitted toward the substrate is referred to as "lower surface emission". In the case of lower surface emission, the first electrode corresponds to an anode, while the second electrode corresponds to a cathode.

In the case of the lower surface emission of the present embodiment, where the pixel arrangement (FIG. 1) of the present invention is used, the number of current supply lines can be halved. Therefore, there is a multiplier effect that a high numerical aperture is obtained.

Embodiment 7

Figure 15A:
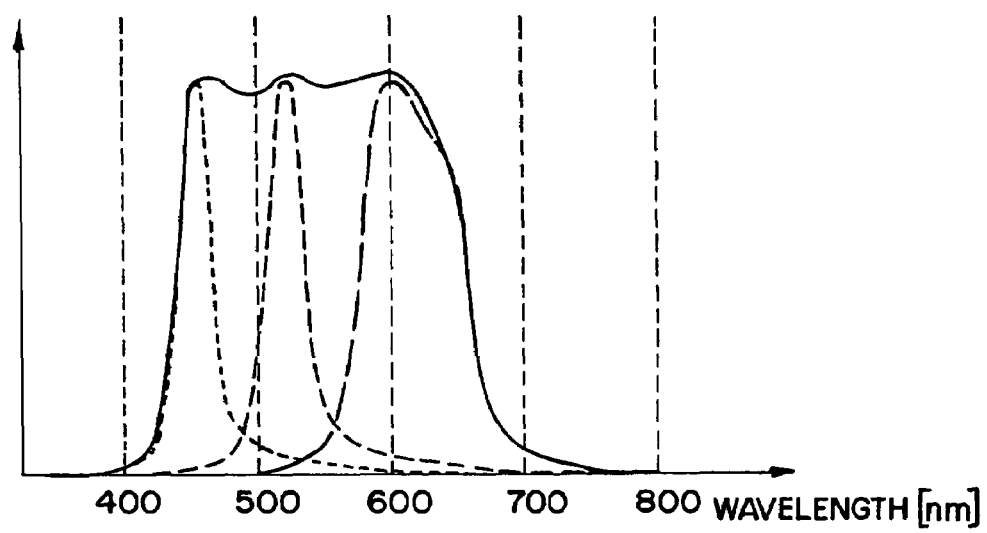
FIGS. 15A and 15B are diagrams showing an example in which emitted white light is obtained using red, green, and blue colors of emitted light and an example in which emitted white light is obtained using blue and yellow colors of emitted light.
Figure 15B:
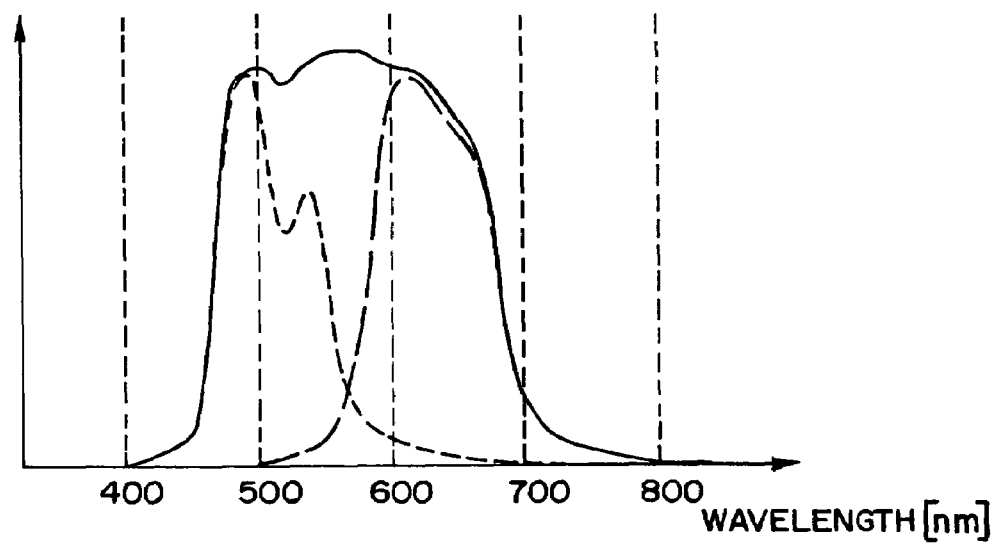

Finally, an example of obtaining white light emission is described. Methods of obtaining white light emission include additive color mixing in which emissive layers for producing R (red), G (green), and B (blue) colors of light that are the three primary colors of light are stacked to add and mix the colors as shown in FIG. 15A and a method making use of the relation between two complementary colors as shown in FIG. 15B. Where complementary colors are used, a combination of blue-yellow or blue green-orange is known. It is considered that the latter is especially advantageous in that light emission in a wavelength region of a relatively high visual sensitivity can be utilized.

Embodiment 8

Electronic appliances using the light emitting apparatus of the present invention include, for example, video cameras, digital cameras, goggle type displays (head mount displays), navigation systems, audio reproducing devices (such as car audio and audio components), notebook personal computers, game machines, mobile information terminals (such as mobile computers, mobile phones, portable game machines, and electronic books), and image reproducing devices provided with a recording medium (specifically, devices for reproducing a recording medium such as a digital versatile disc (DVD), which includes a display capable of displaying images). In particular, in the case of mobile information terminals, since a high priority is placed on the width of the view angle, the portable information terminals with many opportunities to be viewed from oblique directions preferably use the light emitting apparatus. Practical examples are shown in FIGS. 16A–16H. In addition, electronic appliances illustrated in this specification are just examples, therefore the invention is applicable particularly, but not exclusively, to those examples.

Figure 16A:
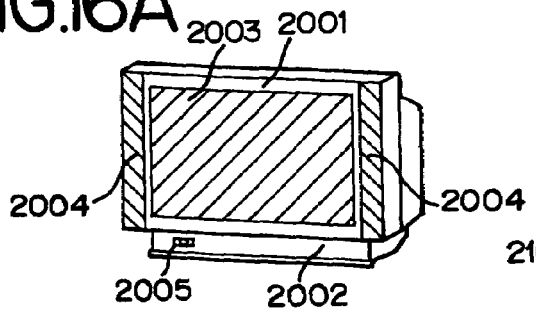
FIGS. 16A to 16H are views showing examples of electronic apparatus to which the present invention can be applied.

FIG. 16A shows a light emitting apparatus, which contains a casing 2001, a support base 2002, a display portion 2003, a speaker portion 2004, a video input terminal 2005, and the like. The light emitting apparatus of the present invention can be applied to the display portion 2003. Further, the light emitting apparatus shown in FIG. 16A is completed with the present invention. Since the light emitting apparatus is of self-light emitting type, it does not need a back light, and therefore a display portion that is thinner than that of a liquid crystal display can be obtained. Note that light emitting apparatuses include all information display devices, for example, personal computers, television broadcast transmitter-receivers, and advertisement displays.

Figure 16B:
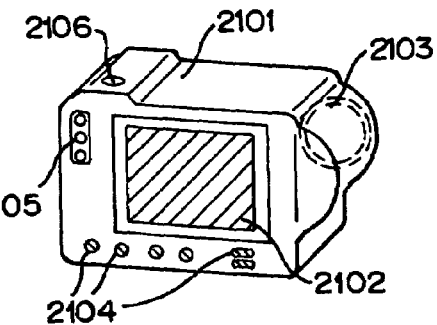

FIG. 16B shows a digital still camera, which contains a main body 2101, a display portion 2102, an image receiving portion 2103, operation keys 2104, an external connection port 2105, a shutter 2106, and the like. The light emitting apparatus of the present invention can be applied to the display portion 2102. Further, the digital still camera shown in FIG. 16B is completed with the present invention.

Figure 16C:
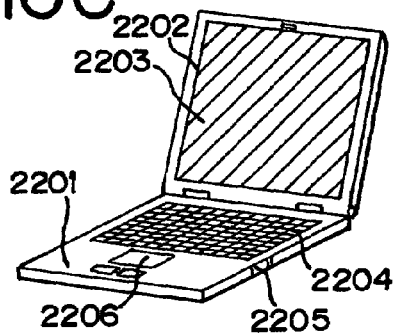

FIG. 16C shows a notebook personal computer, which contains a main body 2201, a casing 2202, a display portion 2203, a keyboard 2204, external connection ports 2205, a pointing mouse 2206, and the like. The light emitting apparatus of the present invention can be applied to the display portion 2203. Further, the light emitting apparatus shown in FIG. 16C is completed with the present invention.

Figure 16D:
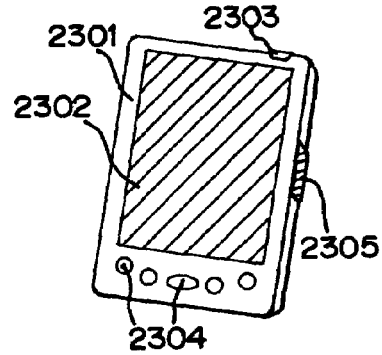

FIG. 16D shows a mobile computer, which contains a main body 2301, a display portion 2302, a switch 2303, operation keys 2304, an infrared port 2305, and the like. The light emitting apparatus of the present invention can be applied to the display portion 2303. Further, the mobile computer shown in FIG. 16D is completed with the present invention.

Figure 16E:
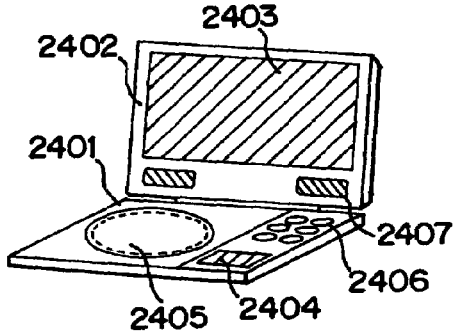

FIG. 16E shows a portable image reproducing device provided with a recording medium (specifically, a DVD reproducing device), which contains a main body 2401, a casing 2402, a display portion A 2403, a display portion B 2404, a recording medium (such as a DVD) read-in portion 2405, operation keys 2406, a speaker portion 2407, and the like. The display portion A 2403 mainly displays image information, and the display portion B 2404 mainly displays character information. The light emitting apparatus of the present invention can be used in the display portion A 2403 and in the display portion B 2404. Note that family game machines and the like are included in the image reproducing devices provided with a recording medium. Further, the DVD reproducing device shown in FIG. 16E is completed with the present invention.

Figure 16F:
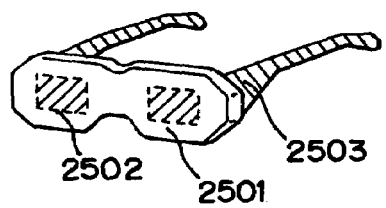

FIG. 16F shows a goggle type display (head mounted display), which contains a main body 2501, a display portion 2502, an arm portion 2503, and the like. The light emitting apparatus of the present invention can be used in the display portion 2502. The goggle type display shown in FIG. 16F is completed with the present invention.

Figure 16G:
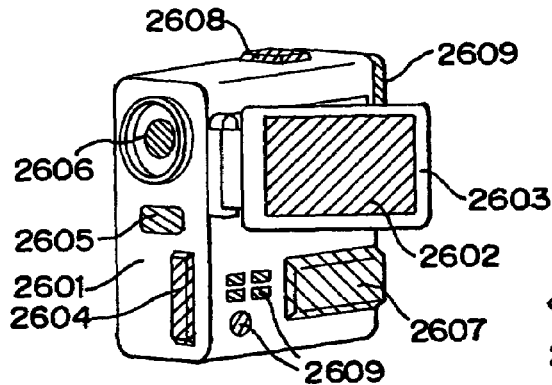

FIG. 16G shows a video camera, which contains a main body 2601, a display portion 2602, a casing 2603, external connection ports 2604, a remote control reception portion 2605, an image receiving portion 2606, a battery 2607, an audio input portion 2608, operation keys 2609, an eyepiece portion 2610, and the like. The light emitting apparatus of the present invention can be used in the display portion 2602. The video camera shown in FIG. 16G is completed with the present invention.

Figure 16H:
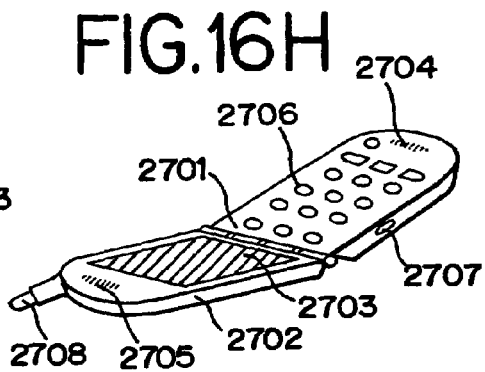

Here, FIG. 16H shows a mobile phone, which contains a main body 2701, a casing 2702, a display portion 2703, an audio input portion 2704, an audio output portion 2705, operation keys 2706, external connection ports 2707, an antenna 2708, and the like. The light emitting apparatus of the present invention can be used in the display portion 2703. Note that, by displaying white characters on a black background, the current consumption of the mobile phone can be suppressed. Further, the mobile phone shown in FIG. 16H is completed with the present invention.

When the emission luminance of light emitting materials is increased in the future, the light emitting apparatus will be able to be applied to a front or rear type projector for magnifying and projecting outputted light containing image information by a lens or the like.

Cases are increasing in which the above-described electronic appliances display information distributed via electronic communication lines such as the Internet and CATVs (cable TVs). Particularly increased are cases where dynamic picture information is displayed. Since the response speed of the light emitting materials is very high, the light emitting apparatus is preferably used for dynamic picture display.

Since the light emitting apparatus consumes power in a light emitting portion, information is desirably displayed so that the light emitting portions are reduced as much as possible. Thus, in the case where the light emitting apparatus is used for a display portion of a mobile information terminal, particularly, a mobile phone, an audio playback device, or the like, which primarily displays character information, it is preferable that the character information be formed in the light emitting portions with the non-light emitting portions being used as the background.

As described above, the application range of the present invention is very wide, so that the invention can be used for electronic appliances in all of fields. The electronic appliances according to this embodiment may use the structure of the light emitting apparatus according to any one of Embodiments 1 to 6.

What is claimed is:

1. A light emitting apparatus having a pixel portion, plural data lines, plural first scan lines, and plural second scan lines;
   wherein the pixel portion has pixels arranged in a matrix, each of the pixels including a first light-emitting device emitting a first color of light, a second light-emitting device emitting a second color of light, and a third light-emitting device emitting a third color of light;
   wherein the first light-emitting device, the second light-emitting device and the third light-emitting device are arranged in a column and long axes of the first light-emitting device, the second light-emitting device and the third light-emitting device are disposed parallel to the first scan lines; and
   wherein a ratio of light intensities of the first color of light: the second color of light: the third color of light is $\alpha:\beta:\gamma$, and a ratio of emission times of the first light-emitting device: the second light-emitting device: the third light-emitting device is $1/\alpha:1/\beta:1/\gamma$ while the light emitting apparatus displays white color.

2. The light emitting apparatus of claim 1, wherein the first color of light, the second color of light and the third color of light are obtained by passing monochrome lights through color filters or color conversion layers.

3. The light emitting apparatus of claim 1, wherein the first color of light, the second color of light and the third color of light are obtained by light-emitting materials that emit the first color of light, the second color of light and the third color of light respectively.

4. Electronic apparatus using the light emitting apparatus as set forth in claim 1.

5. A light emitting apparatus having a pixel portion;
   wherein the pixel portion has pixels arranged in a matrix, each of the pixels including a first light-emitting device emitting a first color of light, a second light-emitting device emitting a second color of light, and a third light-emitting device emitting a third color of light;
   wherein each of the first light-emitting device, the second light-emitting device and the third light-emitting device has a data line, a first scan line, a second scan line, a first transistor, a second transistor and a third transistor;
   wherein the first transistor has a gate electrode electrically connected with the corresponding first scan line;
   wherein the second transistor has a gate electrode electrically connected with the corresponding second scan line;
   wherein the third transistor has a gate electrode electrically connected with a source region or a drain region of the corresponding first transistor;
   wherein a source region or a drain region of the third transistor is electrically connected with one of the first light-emitting device, the second light-emitting device and the third light-emitting device;
   wherein long axes of the first light-emitting device, the second light-emitting device and the third light-emitting device are disposed parallel to the corresponding first scan line; and
   wherein a ratio of light intensities of the first color of light: the second color of light: the third color of light is $\alpha:\beta:\gamma$, and a ratio of emission times of the first light-emitting device: the second light-emitting device: the third light-emitting device is $1/\alpha:1/\beta:1/\gamma$ while the light emitting apparatus displays white color.

6. The light emitting apparatus of claim 5, wherein the first color of light, the second color of light and the third color of light are obtained by passing monochrome lights through color filters or color conversion layers.

7. The light emitting apparatus of claim 5, wherein the first color of light, the second color of light and the third color of light are obtained by light-emitting materials that emit the first color of light, the second color of light and the third color of light respectively.

8. Electronic apparatus using the light emitting apparatus as set forth in claim 5.

9. A light emitting apparatus having a pixel portion;
   wherein the pixel portion has pixels arranged in a matrix, each of the pixels including a first light-emitting device emitting a first color of light, a second light-emitting device emitting a second color of light, and a third light-emitting device emitting a third color of light;
   wherein each of the first light-emitting device, the second light-emitting device and the third light-emitting device has a data line, a first scan line, a second scan line, a current supply line, a first transistor, a second transistor and a third transistor;
   wherein the first transistor has a gate electrode electrically connected with the corresponding first scan line;
   wherein the second transistor has a gate electrode electrically connected with the corresponding second scan line;
   wherein the third transistor has a gate electrode electrically connected with a source region or a drain region of the corresponding first transistor;
   wherein a source region or a drain region of the third transistor is electrically connected with the corresponding current supply line, while the other of the source region or the drain region of the third transistor is electrically connected with one of the first light-emitting device, the second light-emitting device and the third light-emitting device;
   wherein long axes of the first light-emitting device, the second light-emitting device and the third light-emitting device are disposed parallel to the corresponding first scan line;
   wherein the first light-emitting device, the second light-emitting device and the third light-emitting device are supplied with electrical currents by the corresponding current supply line; and
   wherein a ratio of light intensities of the first color of light: the second color of light: the third color of light is $\alpha:\beta:\gamma$, and a ratio of emission times of the first light-emitting device: the second light-emitting device:

the third light-emitting device is $1/\alpha:1/\beta:1/\gamma$ while the light emitting apparatus displays white color.

10. The light emitting apparatus of claim 9, wherein the first color of light, the second color of light and the third color of light are obtained by passing monochrome lights through color filters or color conversion layers.

11. The light emitting apparatus of claim 9, wherein the first color of light, the second color of light and the third color of light are obtained by light-emitting materials that emit the first color of light, the second color of light and the third color of light respectively.

12. Electronic apparatus using the light emitting apparatus as set forth in claim 9.

13. A light emitting apparatus having a pixel portion;
wherein the pixel portion has pixels arranged in a matrix, each of the pixels including a first light-emitting device emitting a red (R) light, a second light-emitting device emitting a green (G) light, and a third light-emitting device emitting a blue (B) light;
wherein each of the first light-emitting device, the second light-emitting device and the third light-emitting device has a data line, a first scan line, a second scan line, a current supply line, a first transistor, a second transistor and a third transistor;
wherein the first transistor has a gate electrode electrically connected with the corresponding first scan line;
wherein the second transistor has a gate electrode electrically connected with the corresponding second scan line;
wherein the third transistor has a gate electrode electrically connected with a source region or a drain region of the corresponding first transistor;
wherein a source region or a drain region of the third transistor is electrically connected with the corresponding current supply line, while the other of the source region or the drain region of the third transistor is electrically connected with one of the first light-emitting device, the second light-emitting device and the third light-emitting device;
wherein long axes of the first light-emitting device, the second light-emitting device and the third light-emitting device are disposed parallel to the corresponding first scan line;
wherein the first light-emitting device, the second light-emitting device and the third light-emitting device are supplied with electrical currents by the corresponding current supply line; and
wherein a ratio of light intensities of the red (R) light: the green (G) light: the blue (B) light is $\alpha:\beta:\gamma$, and a ratio of emission times of the first light-emitting device: the second light-emitting device: the third light-emitting device is $1/\alpha:1/\beta:1/\gamma$ while the light emitting apparatus displays white color.

14. The light emitting apparatus of claim 13, wherein the red (R) light, the green (G) light, and the blue (B) light are obtained by passing monochrome lights through color filters or color conversion layers.

15. The light emitting apparatus of claim 13, wherein the red (R) light, the green (G) light, and the blue (B) light are obtained by light-emitting materials that emit the red (R) light, the green (G) light, and the blue (B) light respectively.

16. Electronic apparatus using the light emitting apparatus as set forth in claim 13.

17. A light emitting apparatus having pixels, M data lines, 3N first scan lines, and 3N second scan lines;
wherein the pixels are arranged in a matrix in N rows and M columns;
wherein each of the pixels includes three light-emitting devices, each of the three light-emitting devices emits a first color of light, a second color of light or a third color of light;
wherein a first light-emitting device emitting the first color of light, a second light-emitting device emitting the second color of light and a third light-emitting device emitting the third color of light are arranged in a pixel and long axes of the first light-emitting device, the second light-emitting device and the third light-emitting device are disposed parallel to the first scan lines; and
wherein a ratio of light intensities of the first color of light: the second color of light: the third color of light is $\alpha:\beta:\gamma$, and a ratio of emission times of the first light-emitting device: the second light-emitting device the third light-emitting device is $1/\alpha:1/\beta:1/\gamma$ while the light emitting apparatus displays white color.

18. The light emitting apparatus of claim 17, wherein the first color of light, the second color of light and the third color of light are obtained by passing monochrome lights through color filters or color conversion layers.

19. The light emitting apparatus of claim 17, wherein the first color of light, the second color of light and the third color of light are obtained by light-emitting materials that emit the first color of light, the second color of light and the third color of light respectively.

20. Electronic apparatus using the light emitting apparatus as set forth in claim 17.

21. A light emitting apparatus comprising:
a first writing scan line extending in a first direction;
a first erasing scan line extending in the first direction;
a data line extending across the first direction;
a second writing scan line extending in the first direction;
a second erasing scan line extending in the first direction;
a third writing scan line extending in the first direction;
a third erasing scan line extending in the first direction,
a first subpixel defined by the first writing scan line, the first erasing scan line and the data line;
a second subpixel defined by the second writing scan line, the second erasing scan line and the data line;
a third subpixel defined by the third writing scan line, the third erasing scan line and the data line,
a first light-emitting device in the first subpixel, the first light-emitting device emits a first color of light;
a second light-emitting device in the second subpixel, the second light-emitting device emits a second color of light being different from the first color of light;
a third light-emitting device in the third subpixel, the third light-emitting device emits a third color of light being different from the first color of light and the second color of light,
each of the first light-emitting device, the second light-emitting device and the third light-emitting device comprising at least a first transistor, a second transistor and a third transistor, wherein a gate electrode of the first transistor is electrically connected with the corresponding writing scan line, a gate electrode of the second transistor is electrically connected with the corresponding erasing scan line, a gate electrode of the third transistor is electrically connected with a source or a drain region of the first transistor; wherein a source region or a drain region of the third transistor is electrically connected with the corresponding light-emitting device, and
wherein a ratio of light intensities of the first color of light: the second color of light: the third color of light is α:β:γ, and a ratio of emission times of the first light-emitting device: the second light-emitting device: the third light-emitting device is 1/α:1/β:1/γ while the light emitting apparatus displays white color.

22. The light emitting apparatus of claim 21, wherein the first color of light, the second color of light and the third color of light are obtained by passing monochrome lights through color filters or color conversion layers.

23. The light emitting apparatus of claim 21, wherein the first color of light, the second color of light and the third color of light are obtained by light-emitting materials that emit the first color of light, the second color of light and the third color of light respectively.

24. Electronic apparatus using the light emitting apparatus as set forth in claim 21.

25. A method of driving a light emitting apparatus having a pixel portion, plural data lines, plural first scan lines, and plural second scan lines;
wherein the pixel portion has pixels arranged in a matrix, each of the pixels includes a first light-emitting device emitting a first color of light, a second light-emitting device emitting a second color of light, and a third light-emitting device emitting a third color of light; and
wherein the first light-emitting device, the second light-emitting device and the third light-emitting device are arranged in a column and long axes of the first light-emitting device, the second light-emitting device and the third light-emitting device are disposed parallel to the first scan lines;
the method comprising the step of controlling emission times so that a ratio of emission times of the first light-emitting device: the second light-emitting device: the third light-emitting device is 1/α:1/β:1/γ while the light emitting apparatus displays white color, providing a ratio of light intensities of the first color of light: the second color of light: the third color of light is α:β:γ.

26. Electronic apparatus using the method of driving the light emitting apparatus as set forth in claim 25.

27. A method of driving a light emitting apparatus having a pixel portion, plural data lines, plural first scan lines, and plural second scan lines;
wherein the pixel portion has pixels arranged in a matrix, each of the pixels includes a first light-emitting device emitting a first color of light, a second light-emitting device emitting a second color of light, and a third light-emitting device emitting a third color of light; and
wherein the first light-emitting device, the second light-emitting device and the third light-emitting device are arranged in a column and long axes of the first light-emitting device, the second light-emitting device and the third light-emitting device are disposed parallel to the first scan lines;
the method comprising the steps of:
establishing a frame period corresponding to synchronization timing of a video signal applied from the data lines to the first light-emitting device, the second light-emitting device and the third light-emitting device, and plural subframe periods obtained by dividing the frame period, each of the subframe periods having a phase during which the video signal is written to the first light-emitting device, the second light-emitting device and the third light-emitting device, a phase during which the first light-emitting device, the second light-emitting device and the third light-emitting device emit in response to the video signal, and a phase during which the first light-emitting device, the second light-emitting device and the third light-emitting device are ceased to emit; and
controlling emission times so that a ratio of emission times of the first light-emitting device: the second light-emitting device: the third light-emitting device is 1/α:1/β:1/γ while the light emitting apparatus displays white color, providing a ratio of light intensities of the first color of light: the second color of light the third color of light is α:β:γ.

28. Electronic apparatus using the method of driving the light emitting apparatus as set forth in claim 27.

29. A method of driving a light emitting apparatus having a pixel portion, plural data lines, plural first scan lines, and plural second scan lines;
wherein the pixel portion has pixels arranged in a matrix, each of the pixels includes a first light-emitting device emitting a first color of light, a second light-emitting device emitting a second color of light, and a third light-emitting device emitting a third color of light; and
wherein the first light-emitting device, the second light-emitting device and the third light-emitting device are arranged in a column and long axes of the first light-emitting device, the second light-emitting device and the third light-emitting device are disposed parallel to the first scan lines;
the method comprising the steps of:
writing a video signal to the first light-emitting devices, the second light-emitting devices and the third light-emitting devices in one row in a selected state of the first scan lines;
letting the first light-emitting device, the second light-emitting device and the third light-emitting device emit in response to the video signal; and
controlling emission times so that a ratio of emission times of the first light-emitting device: the second light-emitting device: the third light-emitting device is 1/α:1/β:1/γ while the light emitting apparatus displays white color by simultaneously turning off the first light-emitting device, the second light-emitting device and the third light-emitting device, providing a ratio of light intensities of the first color of light: the second color of light: the third color of light is α:β:γ.

30. Electronic apparatus using the method of driving the light emitting apparatus as set forth in claim 29.

31. A method of driving a light emitting apparatus having a pixel portion, plural data lines, plural first scan lines, and plural second scan lines;
wherein the pixel portion has pixels arranged in a matrix, each of the pixels includes a first light-emitting device emitting a first color of light, a second light-emitting device emitting a second color of light, and a third light-emitting device emitting a third color of light;
wherein the first light-emitting device, the second light-emitting device and the third light-emitting device are arranged in a column and long axes of the first light-emitting device, the second light-emitting device and the third light-emitting device are disposed parallel to the first scan lines;
the method comprising the steps of:
performing a first step of writing a first video signal to the first light-emitting device;
performing a second step of writing a second video signal to the second light-emitting device;
performing a third step of writing a third video signal to the third light-emitting device;

performing a fourth step of turning off the first light-emitting device;

performing a fifth step of turning off the second light-emitting device;

performing a sixth step of turning off the third light-emitting device;

wherein each of the first video signal, second video signal and third video signal is written simultaneously to light-emitting devices connected with an identical one of the first scan lines;

wherein the turning off is done simultaneously to light-emitting devices connected with an identical one of the second scan lines; and controlling emission times so that a ratio of emission times of the first light-emitting device: the second light-emitting device: the third light-emitting device is $1/\alpha:1/\beta:1/\gamma$ while the light emitting apparatus displays white color by controlling timings at which the fourth step, fifth step and sixth step are started independently, providing a ratio of light intensities of the first color of light: the second color of light: the third color of light is $\alpha:\beta:\gamma$.

32. Electronic apparatus using the method of driving the light emitting apparatus as set forth in claim 31.

33. The light emitting apparatus of claim 1, wherein the light-emitting devices, the scan lines and the data lines are fabricated over a same substrate.

34. The light emitting apparatus of claim 5, wherein the light-emitting devices, the scan lines and the data lines are fabricated over a same substrate.

35. The light emitting apparatus of claim 9, wherein the light-emitting devices, the scan lines and the data lines are fabricated over a same substrate.

36. The light emitting apparatus of claim 13, wherein the light-emitting devices, the scan lines and the data lines are fabricated over a same substrate.

37. The light emitting apparatus of claim 17, wherein the light-emitting devices, the scan lines and the data lines are fabricated over a same substrate.

38. The light emitting apparatus of claim 21, wherein the light-emitting devices, the scan lines and the data lines are fabricated over a same substrate.

39. The light emitting apparatus of claim 25, wherein the light-emitting devices, the scan lines and the data lines are fabricated over a same substrate.

40. The light emitting apparatus of claim 27, wherein the light-emitting devices, the scan lines and the data lines are fabricated over a same substrate.

41. The light emitting apparatus of claim 29, wherein the light-emitting devices, the scan lines and the data lines are fabricated over a same substrate.

42. The light emitting apparatus of claim 31, wherein the light-emitting devices, the scan lines and the data lines are fabricated over a same substrate.

* * * * *